(12) United States Patent
El-Ella

(10) Patent No.: US 12,425,034 B2
(45) Date of Patent: Sep. 23, 2025

(54) DIAMOND-BASED ATOMIC CLOCK

(71) Applicant: AdamanT Quanta AB, Lund (SE)

(72) Inventor: Haitham El-Ella, Malmö (SE)

(73) Assignee: AdamanT Quanta AB, Lund (SE)

( * ) Notice: Subject to any disclaimer, the term of this patent is extended or adjusted under 35 U.S.C. 154(b) by 0 days.

(21) Appl. No.: 18/867,889

(22) PCT Filed: May 23, 2023

(86) PCT No.: PCT/EP2023/063792
§ 371 (c)(1),
(2) Date: Nov. 21, 2024

(87) PCT Pub. No.: WO2023/227604
PCT Pub. Date: Nov. 30, 2023

(65) Prior Publication Data
US 2025/0260409 A1    Aug. 14, 2025

(30) Foreign Application Priority Data

May 23, 2022    (EP) ..................................... 22174961

(51) Int. Cl.
*H03L 7/26* (2006.01)
(52) U.S. Cl.
CPC ..................... *H03L 7/26* (2013.01)
(58) Field of Classification Search
CPC ........................................................ H03L 7/26
USPC ....................................................... 331/94.1
See application file for complete search history.

(56) References Cited

U.S. PATENT DOCUMENTS

| | | | |
|---|---|---|---|
| 9,966,720 B2 * | 5/2018 | Liu ........................... | H01S 1/02 |
| 2014/0247094 A1 | 9/2014 | Englund et al. | |
| 2021/0336409 A1 | 10/2021 | Nikolov et al. | |
| 2023/0095704 A1 * | 3/2023 | Briggs ...................... | H03L 7/26 |
| | | | 331/94.1 |

(Continued)

OTHER PUBLICATIONS

International Search Report & Written Opinion dated Sep. 8, 2023 pertaining to PCT International application No. PCT/EP2023/063792 filed May 23, 2023, pp. 1-12.

(Continued)

*Primary Examiner* — Joseph Chang
(74) *Attorney, Agent, or Firm* — Dinsmore & Shohl LLP

(57) ABSTRACT

An atomic clock device has a diamond-based structure with nitrogen-vacancy defects and nitrogen-vacancy clusters, at least one light emitting diode to illuminate the diamond-based structure, a microwave pump generator to generate a microwave pump signal, a microwave probe generator to generate a pulsed microwave probe signal, a radiofrequency pump generator to generate a radiofrequency pump signal, a radiofrequency probe generator to generate a pulsed radiofrequency probe signal, one or more transmission lines or an antenna structure to feed the pump signals to the diamond-based structure, and a detector to detect a response from the diamond-based structure in response to the pump signals, wherein a frequency spectrum of the response has a sharp spectral feature, and wherein the atomic clock device is configured to generate an output clock signal, based on the sharp spectral feature. A method is provided for generating a clock signal.

19 Claims, 12 Drawing Sheets

(56) References Cited

U.S. PATENT DOCUMENTS

2023/0370074 A1* 11/2023 Xu .......................... G04F 5/14

OTHER PUBLICATIONS

Xie, T. et al. "Identity Test of Single NV—Centers in Diamond at Hz-Precision Level" arXiv, Jul. 3, 2021, pp. 1-6, including Supplemental Material pp. 1-12.
Barry, J. et al. "Sensitivity Optimization for NV-Diamond Magnetometry" arXiv, May 28, 2020, pp. 1-73, DOI: 10.1103/REVMODPHYS.92.015004.
El-Ella, H. et al. "Continuous microwave hole burning and population oscillations in a diamond spin ensemble" arXiv, Dec. 3, 2019, pp. 1-10, DOI: 10.1103/PHYSREVB.100.214407.

* cited by examiner

DIAMOND-BASED ATOMIC CLOCK

CROSS-REFERENCE TO RELATED APPLICATIONS

The present application is the National Phase entry of International Patent Application No. PCT/EP2023/063792, filed May 23, 2023, which claims priority to European Patent Application No. 22174961.7, filed May 23, 2022, the entire contents of both are hereby incorporated by reference into this application.

TECHNICAL FIELD

The invention relates to a diamond-based atomic clock and to a method for generating a clock signal.

BACKGROUND

Most electronic devices, and especially digital systems, require some form of clock signal to function. The requirements on the quality of the clock signal, and thereby its source, can vary considerably depending on the application.

Clock generators for consumer electronics typically have few restringing requirements and a timing error in the order of one second a day is tolerated. For many consumer electronics, LC and RC resonators, quartz crystals, or piezoelectric semiconductors are typically sufficient. For these applications a reduced cost, preferably below 1 €, is more crucial than the actual clock signal accuracy and stability.

For other application, for example in test and measurement systems and in telecom infrastructure, a better timing error, of at least one second per month, is desirable.

Clock generators for these applications are typically based on resonators, such as dielectric cavities, masers, or temperature-controlled crystal oscillators. Atomic clocks are used when the required timing error is as small as possible, preferably at least one second per millennium. Typical atomic clocks consist of electronic oscillators regulated by, or disciplined to, the natural quantum vibrational frequencies of an atomic system. Accessible atomic systems include rubidium lamp/vapour cells, optical lattices, and atomic fountains, all which typically utilize rubidium or caesium atomic sources. Barring a few exceptions, atomic clocks are usually large in size, heavy, and costly. Given the number of auxiliary electronic systems and equipment needed for their operation, reducing their technical footprint to that of chip-scale devices that can be soldered onto printed circuit boards, while retaining their timing accuracy and stability, is an ongoing challenge.

SUMMARY

The present disclosure addresses problems and challenges related to atomic clock generation at chip scale.

Current chip-scale atomic clocks are typically based on small vapour cells on suspended platform. The present disclosure is related to chip scale solid-state atomic clock and time keeping devices using diamond-based structures.

The present disclosure relates, according to a first embodiment, to an atomic clock comprising:
- a diamond-based structure with nitrogen-vacancy defects and nitrogen-vacancy clusters;
- at least one green laser diode configured to illuminate the diamond-based structure;
- a microwave pump generator configured to generate a microwave pump signal;
- a microwave probe generator configured to generate a pulsed microwave probe signal;
- a radiofrequency pump generator configured to generate a radiofrequency pump signal;
- a radiofrequency probe generator configured to generate a pulsed radiofrequency probe signal;
- one or more transmission lines or an antenna structure to feed the microwave pump signal, the pulsed microwave probe signal, the radiofrequency pump signal and the pulsed radiofrequency probe signal to the diamond-based structure; and
- a detector configured to detect a response from the diamond-based structure, wherein a frequency spectrum of said response comprises a sharp spectral feature;

wherein the atomic clock is configured to generate an output clock signal, based on the sharp spectral feature.

In one embodiment of the present disclosure, the sharp spectral feature of the response from the diamond-based structure may be generated using multiple frequency signals;

In one embodiment of the present disclosure, the sharp spectral feature may be based on burnt spectral holes, a population oscillation spike, and/or electromagnetically induced transparencies and/or other physical properties of the diamond-based structure that, under excitation, generate a sharp spectral feature.

The presently disclosed system may be based on spectral hole burning of diamond-based structures with nitrogen-vacancy defects. Spectral hole burning is an experimental technique used to characterize in-homogeneously broadened ensembles of discrete or quasi-discrete transitions. In particular, a diamond-based structure with nitrogen-vacancy defects may be excited and a response may be observed, showing a sharp dip in its measured spectrum. In one embodiment of the present disclosure, with a particular diamond-based structures and with a given density of nitrogen-vacancy defects and a given density of nitrogen-vacancy cluster, and with particular excitations and excitation sequences, a sharp dip may be observed and a very precise clock frequency may be generated. Such a sharp dip can display a spectral detuning, or a full width at half maximum, (defined as a fraction to the carrier frequency), of below $10^{-9}$, preferably less than $10^{-10}$, more preferably less than $10^{-12}$.

In one embodiment of the present disclosure, based on the properties of a described diamond-based structure, and based on the described excitation sequence, a chip-scale solid-state atomic clock may be obtained, which may have applications in many different fields, including GPS navigation systems, telecommunications, data transmission, and satellite-based communications.

Spectral hole burning in diamond-based structures with nitrogen-vacancy defect may be obtained by use of a diode illuminating the diamond-based structure, a microwave pump excitation signal and a microwave probe excitation signal. A response from the diamond-based structure may be measured by use of a photodiode.

Use of microwave excitations to generate continuous microwave hole burning has already been studied in "Continuous microwave hole burning and population oscillations in a diamond spin ensemble", El-Ella et al. Phys. Rev B. 100, 214407 (2019). In one embodiment of the present disclosure, microwave excitation is employed together with illumination from at least one laser diode, and additional radiofrequency excitation in order to drive both the electron spin transitions and nuclear spin transitions in the diamond-based structure, thus obtaining a very sharp spectral feature, such as a spectral hole, with a full width at half maximum (defined as a fraction of the carrier frequency) in the order of, or less than $10^{-9}$, and use the obtained sharp spectral response to discipline a secondary clock and output a very precise clock signal.

A microwave "pump" field may be used to excite and saturate a portion of the ensembles transition (a "subensemble"), and a second microwave probe may be used to scan across the pump fields frequency.

An absence or reduction of signal (a "hole") may then be observed when measuring the frequency-dependent signal, whose characteristics (amplitude, full width at half maximum and temporal persistence) is determined by the subensembles local properties, and by the total ensembles collective interaction with the environment and with itself and the subensemble.

Microwave pump and probe electromagnetic fields, together with a diode illumination of the diamond-based structure, may be used to obtain a spectral hole based on electron spin transitions in the diamond-based structure.

Nuclear spin transitions in the diamond structure may also be excited by use of additional excitation sources, namely a radiofrequency pump and a radiofrequency probe signal.

The disclosure describes a system design where the diamond-based structure is excited, in some sequence, by the laser diodes, microwave pump and probe signals, and radiofrequency pump and probe signals, to drive both the electron spin transitions and the nuclear spin transitions in the diamond and thereby burn a sharp spectral hole.

The inventor has therefore designed the presently disclosed system to properly excite the diamond with diode illumination, microwave pump and probe signals, radiofrequency pump and probe signals in order to excite electron spin transitions and nuclear spin transitions in the diamond-based structure, obtain a very sharp dip in the shape of, but not limited to, a burnt spectral hole response from the diamond with a full width at half maximum in below $10^{-9}$, and use the obtained very precise frequency in the burnt hole to lock the system to a very precise frequency of a generated output clock signal.

The present disclosure further relates to a method for generating a clock signal, the method comprising the steps of:
  illuminating a diamond-based structure with nitrogen-vacancy defects and nitrogen-vacancy clusters with at least a green diode.
  generating a microwave pump signal;
  generating a pulsed microwave probe signal;
  generating a radiofrequency pump signal;
  generating a pulsed radiofrequency probe signal;
  feeding the microwave pump signal, the pulsed microwave probe signal, the radiofrequency pump signal and the pulsed radiofrequency probe signal to the diamond-based structure;
  obtaining a response from the diamond-based structure, wherein a frequency spectrum of said response comprises a sharp spectral feature; and
  generating an output clock signal based on said sharp dip.

In one embodiment of the present disclosure, the sharp spectral feature of the response from the diamond-based structure is generated using multiple frequency signals;

In one embodiment of the present disclosure, the sharp spectral feature is based on burnt spectral holes, a population oscillation spike, and/or electromagnetically induced transparencies and/or other physical properties of the diamond-based structure that, under excitation, generate a sharp spectral feature.

It is understood that the presently disclosed system is suitable for carrying out any one or all the steps of the presently disclosed method. In addition, any one and/or all the steps of the presently disclosed method may be carried out using the presently disclosed system.

BRIEF DESCRIPTION OF THE DRAWINGS

The invention will in the following be described with reference to the accompanying drawings.

All drawings are examples of embodiments and not limiting to the presently disclosed atomic clock system and method for generating a clock signal.

DETAILED DESCRIPTION

Figure 1:
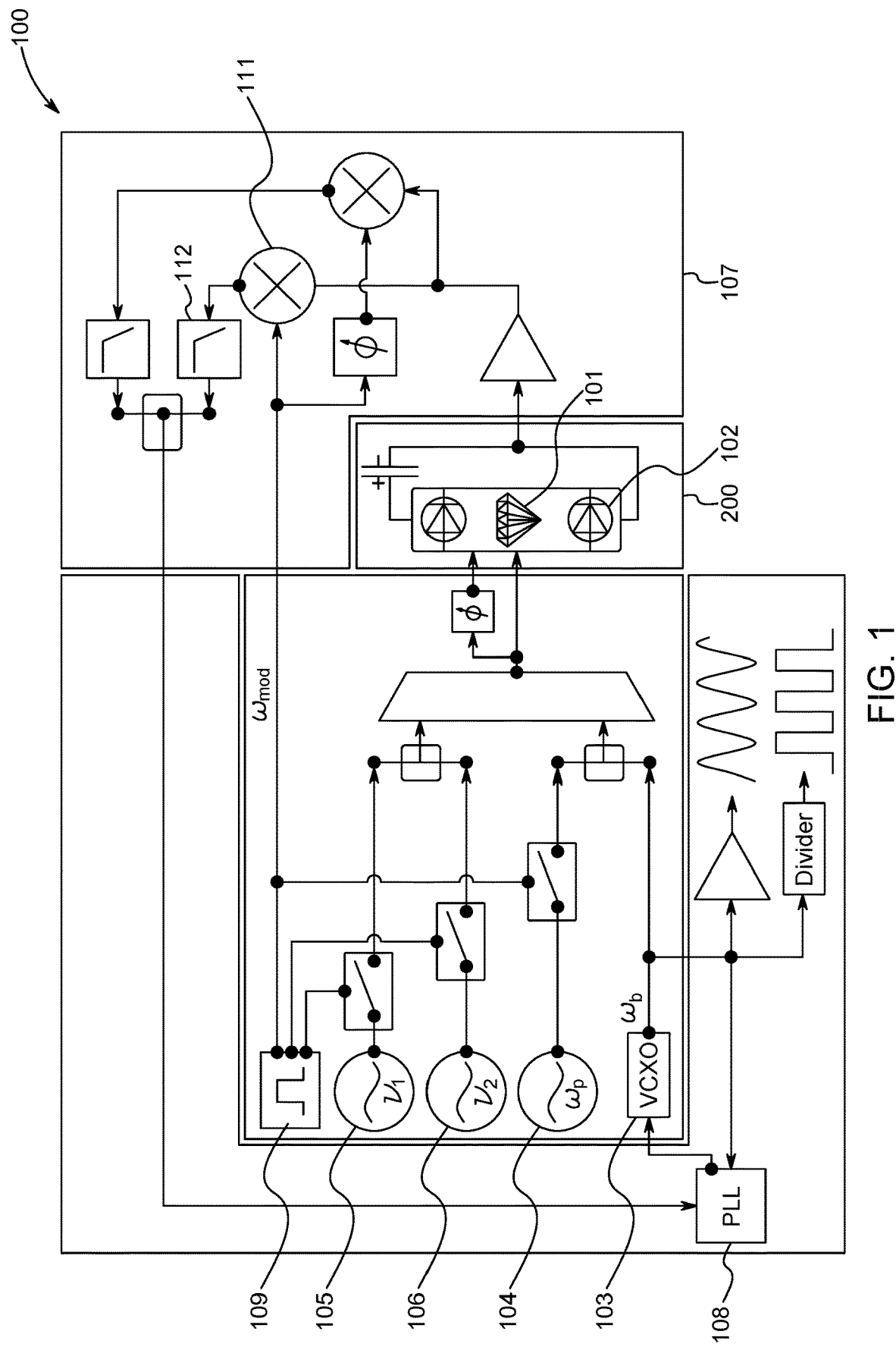
FIG. 1 shows a schematic view of an embodiment of the presently disclosed atomic clock.

FIG. 1 shows a schematic view of one embodiment of the presently disclosed atomic clock (100). In one embodiment, the presently disclosed atomic clock comprises a diamond-based structure (101), at least one light emitting diode (102), a pump microwave generator (103), a probe microwave generator (104), a pump radiofrequency generator (105), a probe radiofrequency generator (106), a detector (107), a phase-locked-loop (PLL) (108), a pulse generator (109).

The present disclosure relates to a time keeping device, which is based on a solid state crystal with electromagnetic resonance frequencies. Such a solid state crystal may be a diamond-based structure. In one embodiment the time keeping device comprises:
- a solid state crystal with electromagnetic resonance frequencies;
- at least one light emitting diode configured to illuminate the solid state crystal;
- a microwave pump generator configured to generate a microwave pump signal;
- a microwave probe generator configured to generate a pulsed microwave probe signal;
- a radiofrequency pump generator configured to generate a radiofrequency pump signal;
- a radiofrequency probe generator configured to generate a pulsed radiofrequency probe signal;
- one or more transmission lines or an antenna structure to feed the microwave pump signal, the pulsed microwave probe signal, the radiofrequency pump signal and the pulsed radiofrequency probe signal to the solid state crystal; and
- a detector configured to detect a response from the solid state crystal, wherein a frequency spectrum of said response comprises a sharp spectral response; and
- wherein the time keeping device is configured to generate a time dependent signal, based on the sharp spectral response.

As a person skilled in the art would understand, technical details in the disclosure can be applied both to a time keeping device and, more specifically, an atomic clock. The light emitting diode may be a laser diode, such as a green laser diode.

A sharp spectral feature may be a sharp spectral response.

The present disclosure further relates to a device, which is based on a resonator, such as a solid state crystal with electromagnetic resonance frequencies. Such a solid state crystal may be a diamond-based structure. In one embodiment the device comprises:
- a resonator, such as a solid state crystal with electromagnetic resonance frequencies;
- at least one illumination source to illuminate the resonator;
- a microwave pump generator configured to generate a microwave pump signal;
- a microwave probe generator configured to generate a pulsed microwave probe signal;
- a radiofrequency pump generator configured to generate a radiofrequency pump signal;
- a radiofrequency probe generator configured to generate a pulsed radiofrequency probe signal;
- one or more transmission lines or an antenna structure to feed the microwave pump signal, the pulsed microwave probe signal, the radiofrequency pump signal and the pulsed radiofrequency probe signal to the resonator; and
- a detector configured to detect a response from the resonator, wherein a frequency spectrum of said response comprises a sharp spectral response; and
- wherein the device is configured to generate a time dependent signal, based on the sharp spectral response.

Preferably, the device comprises a lock-in detection circuit for sensing the response, such as a photocurrent, wherein the lock-in detection circuit is coupled to a phase locked loop (PLL). The lock-in detection circuit may be connected, in a loop, and via a PLL, to the pump oscillator and, together with the PLL, stabilizes the generated frequency of the pump oscillator around an effective frequency corresponding to the sharp spectral feature, with a very small detuning.

As a person skilled in the art would understand, technical details in the disclosure can be applied both to a time keeping device and, more specifically, an atomic clock.

Solid State Crystal with Electromagnetic Resonance Frequencies

The solid-state crystal may be a diamond-based structure.

The presently disclosed atomic clock may comprise a diamond-based structure with nitrogen-vacancy defects and nitrogen vacancy clusters. The specific crystalline structure of the diamond-based structure is advantageous for generation of electron spin and nuclear spin based spectral hole burning.

In one embodiment of the present disclosure, the diamond-based structure may be a diamond with magnetically resonant defects, or a strained photonic crystal membrane with magnetically resonant defects, or a modulated defect composition obtained via chemical vapor deposition (CVD) growth, or a disk obtained by etching or cutting a diamond with magnetically resonant defects, or any diamond-based crystalline structure with nitrogen-vacancy defects or similar magnetically resonant defects.

In one embodiment of the present disclosure, a density of nitrogen-vacancy defects is of at least 5 parts per million, preferably at least 10 parts per million, more preferably at least 20 parts per million, and the density of nitrogen-vacancy defects is less than 100 parts per million. In the present disclosure, the density of the nitrogen-vacancy defects may be high enough, preferably at least 10 parts per million, more preferably at least 20 parts per million to be able to obtain an electronic spin and nuclear spin dependent spectral hole burning. However, the density of the nitrogen-vacancy defects may be below 100 parts per million to avoid nucleation of defects with each other, which changes the electronic structure and response of the diamond-based structure.

In one embodiment of the present disclosure, a density of nitrogen-vacancy clusters in the diamond-based structure may be of at least 1 parts per million, preferably at least 4 parts per million, more preferably at least 7 parts per million. This type of density of nitrogen-vacancy clusters is advantageous for the generation, under proper excitation, of electronic spin and nuclear spin dependent spectral hole burning.

In one embodiment of the present disclosure, the diamond-based structure may be thin enough in order to guarantee uniform laser diode illumination and uniform microwave pump and probe signal irradiation and uniform radiofrequency pump and probe signal irradiation.

In one embodiment of the present disclosure, the synthetic diamond-based structure may be opaque and/or polycrystalline, such as a carbonado.

Excitation: Light-Emitting/Laser Diodes

In one embodiment of the present disclosure, the diamond-based structure may be exposed to a proper excitation, and a spectral hole burning response may be detected to lock an external secondary clock to an effective frequency with a very small detuning from an effective frequency corresponding to the sharp spectral feature.

In one embodiment of the present disclosure, a first source of excitation of the diamond-based structure is provided by one or more laser diodes. The one or more laser diodes may be of any suitable color, preferably a green laser. The one or more laser color may be configured to illuminate the solid state crystal with coherent light.

In one embodiment of the present disclosure, laser illumination may stem from at least one laser diode (102) and may comprise of at least one green laser diode, that is a laser diode configured to irradiate at a wavelength of around 520 nm+/−20 nm. In this disclosure, the expressions "green laser diode" and "green diode" are used interchangeably and are equivalent. The green laser may be a InGaN laser.

In one embodiment of the present disclosure, laser illumination may stem from at least one laser diode (102) and may comprise of at least one blue laser diode, that is a laser diode irradiating at a wavelength of around 450 nm+/−20 nm. In this disclosure, the expressions "blue laser diode" and "blue diode" are used interchangeably and are equivalent. The blue laser may be a InGaN laser.

In one embodiment of the present disclosure, laser illumination may stem from at least one laser diode (102) and may comprise of at least one red laser diode, that is a laser diode irradiating at a wavelength of around 660 nm+/−20 nm. In this disclosure, the expressions "red laser diode" and "red diode" are used interchangeably and are equivalent. The red laser may be a GaInP laser.

In one embodiment, the presently disclosed atomic clock may comprise at least one green laser diode and optionally, at least one blue and/or at least one red laser diode, configured to illuminate the diamond-based structure.

In one embodiment of the present disclosure, laser diodes may illuminate the sides of the diamond-based structure from the sides.

In one embodiment of the present disclosure, laser diodes may illuminate cut facets of the diamond based structure.

Excitation: Microwave and Radiofrequency Signals

In one embodiment of the present disclosure further sources of excitation are provided by the microwave pump and probe signals, and by the radiofrequency pump and probe signal.

In one embodiment of the present disclosure the microwave probe and pump signals may excite electron spin transitions energy levels in the diamond-based structure.

In one embodiment of the present disclosure the radiofrequency probe and pulse signals may excite nuclear spin transition energy levels in the diamond-based structure.

The inventor has realized that, in order to obtain a very sharp spectral hole from the diamond structure, together with microwave pump and probe signals, also radiofrequency pump and probe signals may be used to excite not only electron spin energy levels in the diamond-based structure, but also nuclear spin energy levels, under continuous and/or pulsed laser diode operation. The inventor has realized that by use of radiofrequency pump and probe excitation in addition to microwave pump and probe excitation, the sharpness of a burnt spectral hole may achieve a full width at half maximum (defined as a fraction to the carrier frequency) of less than $10^{-9}$, preferably less than $10^{-10}$, more preferably less than $10^{-12}$.

In one embodiment of the presently disclosed time keeping device, the pulsed microwave probe signal, the radiofrequency pump signal and the pulsed radiofrequency probe signal are modulated at a frequency equal to or a function of a reference frequency. An example of such a configuration is shown in FIG. 1, wherein the the pulsed microwave probe signal, the radiofrequency pump signal and the pulsed radiofrequency probe signal are modulated with a reference frequency $\omega_{mod}$.

The response from the diamond-based structure may be mixed (111) with the frequency reference, which is illustrated in the example of FIG. 1. The response may then be low-pass filtered (112) to obtain a demodulated response signal. The demodulated signal may be sensitive to an instantaneous phase difference between the detected signal and the reference signal.

In the example of FIG. 1, the scheme is drawn to include two mixers, for which one of the signals is 90 degree phase-shifted relative to its other copy. The output of these mixers are then low-pass-filtered and combined, before being sent to the PLL chip.

This is carried out to obtain a signal that is not sensitive to the relative phase. In some cases this may be useful, whereas in other applications it is not desired The response signal or demodulated response signal may regulate a phase locked loop architecture (108). The phase locked loop architecture may be implemented in a digital chip but could also be a sub-architecture, for example implemented as nested or chained phase sensitive detectors, or a combination of fractional and integer PLL sub-systems with distinct reference oscillators. In one embodiment of the present disclosure the atomic clock is configured to provide an excitation sequence of the laser diodes, the microwave and radiofrequency pump and probe signals that is optimized to obtain a spectral hole burning response comprising the effects of the electron spin transitions and the nuclear spin transitions of the diamond.

The microwave and radio frequency signals may be generated by various electronic oscillators, with examples including, but not limited to, digitally controlled frequency synthesizers, voltage controlled LC oscillators, crystal oscillators, and oven-controlled crystal oscillators In one embodiment of the presently disclosed atomic clock, generation and distribution of the microwave and radiofrequency signal may comprise a microwave and a radiofrequency chain of components which consists of, but is not limited to, mixers, combiners, switches, diplexers, amplifiers, phase shifters, and transmission lines and/or antenna structures. In one embodiment of the present disclosure, the irradiation of the diamond-based structure with microwave and radiofrequency signals is carried out with the use of a coplanar waveguide directly underneath the diamond-based structure, which ensures a uniform field amplitude and direction throughout the detected volume of the diamond-based structure.

In one embodiment of the presently disclosed atomic clock, the irradiation of the microwave and radiofrequency signals to the diamond based structure is obtained by use of two coplanar waveguides directly underneath the diamond-based structure. This enables the generation of circular polarized microwave and radiofrequency signals, while also ensuring a uniform field amplitude and direction throughout a detected volume of the diamond-based structure.

Detection

In the presently disclosed atomic clock, the diamond-based structure is excited by laser diode illumination, microwave and radiofrequency pump and probe signals and the response is detected by a detector. The detector may comprise a photodiode capturing fluorescence emanated by the excited diamond-based structure. However, a photodiode-based detection may be challenging because it requires ways to collect and direct light from the diamond-based structure to the photodiode.

In one embodiment of the present disclosure, response of the diamond structure may be detected by reading out photocurrents produced on the surface of the diamond-based structure.

In one embodiment of the present disclosure, the detector may comprise at least one pair of interdigitated electrodes, configured to detect a photocurrent response from the diamond-based structure.

In one embodiment of the present disclosure it is advantageous to use interdigitated electrodes arranged directly on a surface, and in direct contact to the surface of the diamond-based structure to detect photocurrents directly from a more confined area. As a consequence, when the diamond structure is properly excited, the detected photocurrent may have a power spectrum presenting a sharp dip in correspondence to an effective frequency related to the spectral hole or an effective frequency corresponding to the sharp spectral feature related to other phenomena such as a population oscillation spikes, and/or electromagnetically induced transparencies. The inventors are aware that the spectral hole burning response from the diamond may alternatively be detected using a photodiode, in which case care needs to be taken in conveying the fluorescence from the diamond-based structure properly to the photodiode. The detection based on interdigitated electrodes may be more compact and more accurate as compared to the solution based on a photodiode. In particular, detection based on photocurrents may provide a better amplitude and/or contrast to the detected signal and a better signal-to-noise ratio.

In one embodiment of the presently disclosed atomic clock the detector may comprise at least one pair of interdigitated electrodes, configured to detect a photocurrent response from the diamond-based structure.

In one embodiment of the presently disclosed atomic clock the interdigitated pair of electrodes may be arranged in direct contact with a surface of the diamond. Preferably the interdigitated electrodes may be arranged directly on top of the diamond-based structure. Preferably the interdigitated electrodes may be deposited directly on a surface of the diamond-based structure.

For a sharp response with very small detuning and a better signal-to-noise ratio, it is advantageous that the diamond-based structure is not n-doped nor p-doped, and that the surface of the diamond-based structure is not n-doped or p-doped, because n or p doping of the diamond-based structure or its surface may induce dark currents that are detrimental to the photocurrent-based detection of the spectral hole.

In one embodiment of the present disclosure, the diamond-based structure is not p-doped and the diamond-based structure is not n-doped and the surface of the diamond-based structure is not p-doped nor n-doped, such that the diamond-based structure does not suffer from generation of dark currents. In case of n-doping, such as phosphorous based doping and/or in case of p-doping, such as boron doping, dark currents in the diamond-based structure may persist which are detrimental to the detection of the spectral hole burning response.

In one embodiment of the present disclosure, the surface of the diamond-based structure is predominantly oxygen-terminated, and specifically bridge-bonded ether groups such that the diamond-based structures surface does not induce dark current noise. In case of non-oxygen terminated diamond, and in particular an abundance of H-based termination, dark current noise on the diamond-based structure surface may persist which is detrimental to the detection of the spectral hole burning response.

One embodiment of the presently disclosed atomic clock may further comprise a lock-in detection circuit for sensing the response, such as a photocurrent, wherein the lock-in detection circuit is coupled to the phase locked loop (PLL). The lock-in detection circuit may be connected, in a loop, and via a PLL, to the pump oscillator and, together with the PLL, stabilizes the generated frequency of the pump oscillator around an effective frequency corresponding to the sharp spectral feature, with a very small detuning. The photocurrent detection may therefore be locked, in a loop, to the generation of the microwave pump frequency at the effective frequency.

The presently disclosed atomic clock may further comprise a frequency divider (110) configured to generate a clock frequency from a frequency division of the effective frequency.

The presently disclosed atomic clock may further comprise a phase locked loop configured to lock the microwave pump signal to the effective frequency, such as an effective frequency corresponding to the sharp spectral feature.

Physical Structure

One embodiment of the presently disclosed atomic clock further comprises a ceramic chip carrying the diodes, the transmission lines or antenna structure, a diamond-based structure, and the detector.

In one embodiment of the presently disclosed atomic clock the transmission line may be a coplanar waveguide arranged underneath the diamond-based structure. A coplanar waveguide has the advantage of being configured for carrying the microwave pump and probe signals and the radiofrequency signals. The proximity of the coplanar waveguide to the diamond based structure, is advantageous because it ensures a uniform irradiation of the diamond-based structure from the microwave pump and probe signals and from the radiofrequency pump and probe signals. A uniform field irradiation within the diamond-based structure is advantageous because it optimizes amplitude, contrast and signal-to-noise ratio of the response.

In one embodiment of the present disclosure, the coplanar waveguide may be deposited and etched directly on a lower surface of the diamond-based structure. This design choice ensures proximity of the microwave and radiofrequency irradiation to the diamond-based structure.

Figure 2:
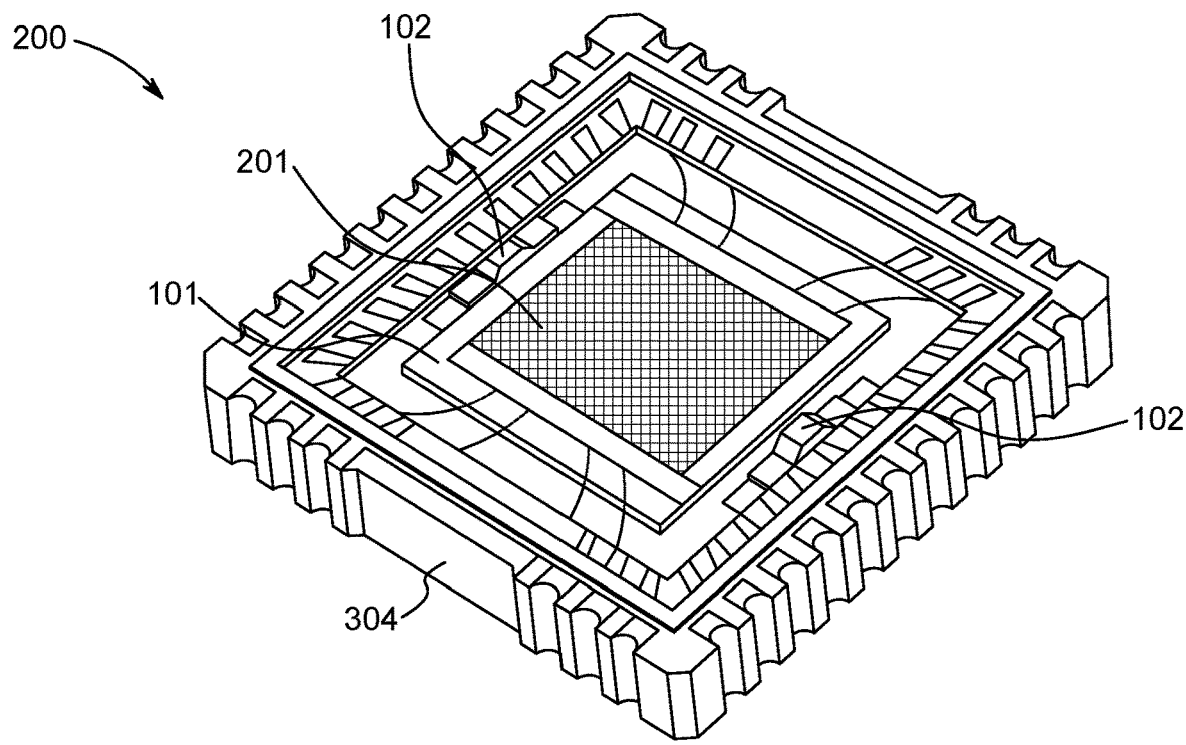
FIG. 2 shows a schematic view of a ceramic chip, in one embodiment of the presently disclosed atomic clock.
Figure 3:
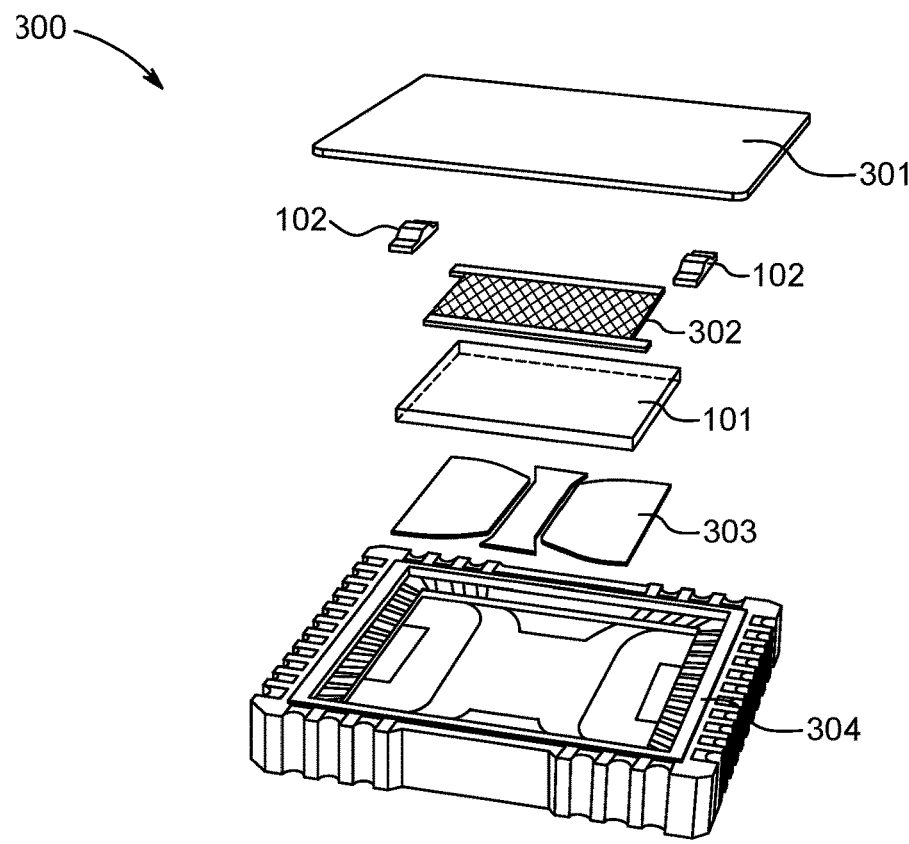
FIG. 3 shows a schematic view of components of a ceramic chip, in one embodiment of the presently disclosed atomic clock.

As shown in FIG. 2 and FIG. 3, one embodiment of the presently disclosed atomic clock further comprises a ceramic chip (200) carrying the diodes (102), the coplanar waveguide (303), the diamond-based structure (101), and the detector.

FIG. 3 shows an exploded view of one embodiment of the ceramic chip of the present disclosure, with the diamond-based structure (101), a custom ceramic chip carrier (304), a co-planar waveguide (303), interdigitated electrodes (302), laser diodes (102) and a lid (301).

In one embodiment of the presently disclosed atomic clock the phase locked loop, the lock-in detection circuit, the microwave generators and the radiofrequency generators may be external to the ceramic chip.

In one embodiment of the presently disclosed atomic clock the microwave pump signal and the microwave probe signal coexist in the transmission line. The pump microwave signal and the probe microwave signal are slightly detuned, in particular they might be detuned by less than 5 kHz when the pump microwave signal has an effective frequency, such as an effective frequency corresponding to the sharp spectral feature, comprised between 2 and 4 GHz.

In one embodiment of the presently disclosed atomic clock the radiofrequency pump signal and the radiofrequency probe signal coexist in the transmission line. The radiofrequency pump signal and the radiofrequency probe signal, may be detuned from each other, they, for example be detuned by between 1 MHz and 10 MHz.

In one embodiment of the presently disclosed atomic clock, two parallel transmission lines are implemented to generate circularly polarized microwave and radiofrequency fields. The relative phase difference of the fields delivered in each respective transmission lines may be up to 90 degrees.

In one embodiment of the present disclosure, the transmission line(s) may be a coplanar waveguide and the coplanar waveguide may be ball bonded onto the base conductors of a ceramic chip and the diamond-based structure may be arranged on top of the coplanar waveguide. In one embodiment, the interdigitated electrodes are wedge bonded to the chip carrier connector pads.

Excitation Sequences

In order to generate a sharp spectral feature such as, but not limited to, a burnt spectral hole, a population oscillation spike, and/or electromagnetically induced transparencies, the diamond-based structure may be excited by an excitation sequence, which involves repeated and timed illumination from the laser diodes and repeated and timed irradiation from the pump and probe microwave signal excitation and the pump and probe radiofrequency signal excitation. Here, some examples of proper excitation sequences will follow, explained also in connection with sequence diagrams of FIGS. 4-12.

In this context, a $\pi$ pulse shall be understood as a pulse configured to resonantly excite a population of quantum states from a first energy level to a second energy level. A $\pi$ pulse designates a specific pulse duration that is a function of the delivered microwave or radiofrequency field amplitude. A $\pi$ pulse may be generated by gating a microwave or a radiofrequency pump or probe sequence by a digitally generated gating pulse, of the duration equivalent to the duration of the $\pi$ pulse. The gating pulse may be generated by the pulse generator (109).

In the presently disclosed atomic clock the laser diodes, the microwave pump and probe generators and the radiofrequency pump and probe generators are configured to generate a repeated excitation sequence.

General Properties of Sequences

In one embodiment of the present disclosure, the repeated excitation sequence comprises at least one $\pi$ pulse of the probe microwave signal and/or at least one $\pi$ pulse of the radiofrequency probe signal.

In one embodiment of the present disclosure, the repeated excitation sequence is such that one $\pi$ pulse of the probe microwave signal precedes one $\pi$ pulse of the radiofrequency probe signal.

In one embodiment of the present disclosure, the repeated excitation sequence is such that pulses from a green laser diode are alternated to pulses from a red laser diode.

In one embodiment of the present disclosure, the repeated excitation sequence is such that pulses from a blue laser diode are simultaneous to every other pulse of a green laser diode.

In one embodiment of the present disclosure, the repeated excitation sequence is such that the microwave pump signal is continuous or pulsed at alternative effective durations, and wherein an effective duration comprises at least one $\pi$ pulse of the probe microwave signal.

In one embodiment of the present disclosure, the repeated excitation sequence is such that the microwave pump signal is continuous or pulsed at alternative effective durations, and wherein an effective duration comprises at least one $\pi$ pulse of the radiofrequency pump signal and at least one $\pi$ pulse of the pump radiofrequency signal.

The inventors have realized that, depending on the different application and depending on a trade-off between signal-to-noise ratio, amplitude of the amplitude of the detected signal (photocurrent or fluorescence) and contrast, different choices of excitation sequences may be made.

For example, the inventors have realized that excitation sequences using a green laser diode may modulate laser and microwave hole-burning field which enhance signal-to-noise ratio of the measured photocurrent or fluorescence, at the expense of the overall signal amplitude or contrast. In other words, a pulsed green laser excitation, as opposed to a continuous one, may be used to increase the signal-to-noise ratio at the expense of the amplitude of the response in some excitation sequences.

In one embodiment of the present disclosure sequences using the blue and/or the red diode may be used to improve contrast, linewidth, and spectral stability of both the detected spin transitions, and of the burnt hole itself.

One embodiment of the present disclosure utilises a blue laser, which has a wavelength of ~450 nm, and reverts the $NV^0$ charge state to the $NV^-$ charge state while also ionizing the surrounding environment.

One embodiment of the present disclosure utilises a red laser, which has wavelength of 660 nm, and which may be more selective as it reverts $NV^0$ to $NV^-$ via a two-photon process without affecting the environment, thereby generating less noise, but this process has lower charge-state conversion fidelity then that associated with blue laser excitation.

One embodiment of the present disclosure uses both blue and red laser diodes, and by carefully balancing their relative powers with respect to the green laser this can be advantageous for maintaining charge state for these pulse sequences.

NV defect can exist as a stable negative or neutral state, and may constantly shift between the two states ($NV^- \leftrightarrow NV^0$) depending on the environment. The electronic level structure of the neutral state is distinct from the negative state.

In order to improve read-out stability, signal-to-noise ratio and contrast, in one embodiment of the present disclosure, a NV-charge state is maintained in the diamond-based structure. In one embodiment of the present disclosure this is achieved by shining red and/or blue wavelengths in one embodiment of the present disclosure.

Detailed Sequences

In one embodiment of the present disclosure, the repeated excitation sequence may comprise at least one $\pi$ pulse of the pulsed microwave probe signal, and/or at least one $\pi$ pulse of the radiofrequency pump signal, and/or at least one $\pi$ pulse of the pulsed radiofrequency probe signal.

Preferably, the repeated excitation sequence in generated in such a way that the combination of signals excite both excite electron spin transitions energy levels and nuclear spin transition energy levels in the solid state crystal.

Figure 4:
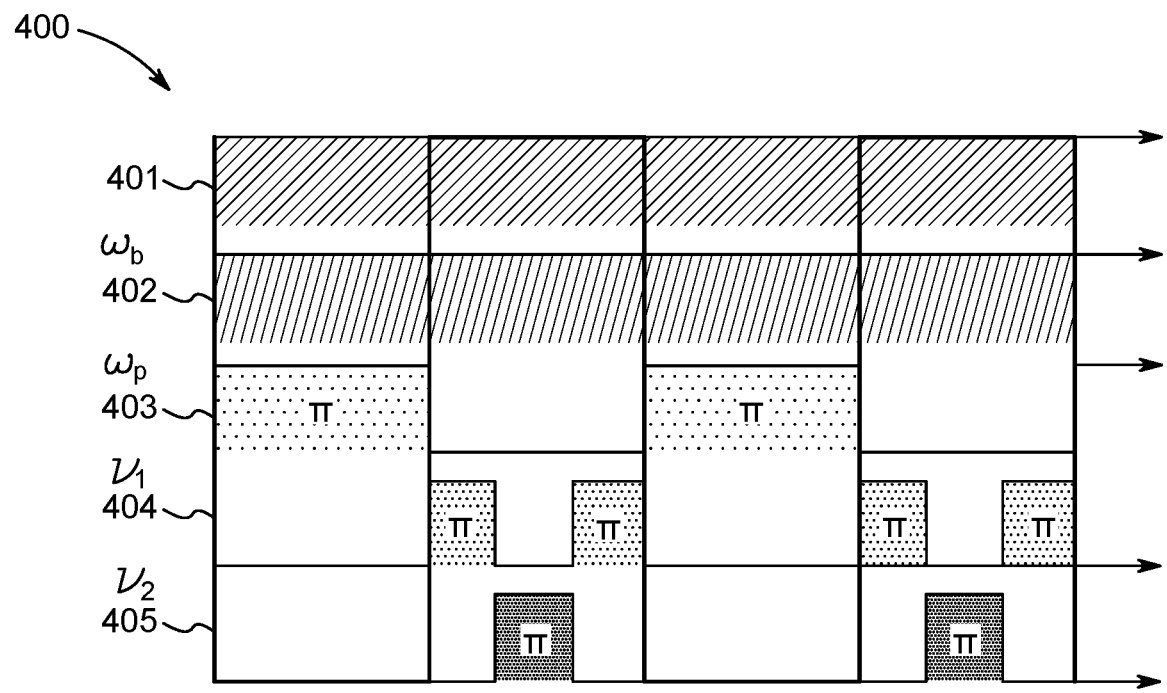
FIG. 4 shows a schematic diagram of an excitation sequence in one embodiment of the presently disclosed atomic clock.

FIG. 4 shows an example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

In one embodiment of the present disclosure the repeated excitation sequence may be ordered and sequentially comprise: 1) a $\pi$ pulse of the pulsed microwave probe signal 2) a $\pi$ pulse of the radiofrequency pump signal 3) a $\pi$ pulse of the pulsed radiofrequency probe signal, and 4) a $\pi$ pulse of the pump radiofrequency signal, and wherein the laser diode is continuously illuminating the diamond-based structure and the applied microwave pump signal is continuous.

Figure 5:
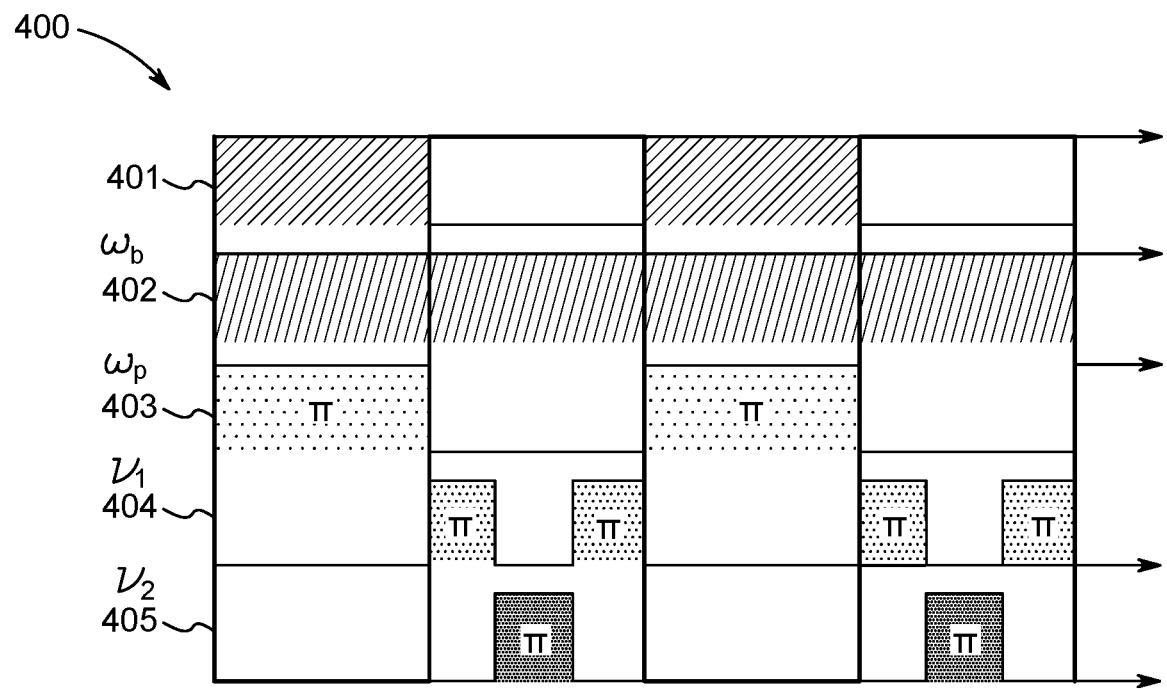
FIG. 5 shows a schematic diagram of an excitation sequence in one embodiment of the presently disclosed atomic clock.

FIG. 5 shows an example of an excitation sequence (400) in one embodiment of the presently disclosed atomic clock: signal (401) is the laser diode illumination; signal (402) is the pump microwave signal; signal (403) is the probe microwave signal; signal (504) is the pump radiofrequency signal; signal (405) is the probe radiofrequency signal.

In one embodiment of the present disclosure the repeated excitation sequence may be ordered and sequentially comprise: 1) a π pulse of the pulsed microwave probe signal; 2) a π pulse of the radiofrequency pump signal 3) a π pulse of the pulsed radiofrequency probe signal, 4) a π pulse of the pump radiofrequency signal; and wherein the laser diode is illuminating the diamond-based structure only for the duration of the π pulse of the pulsed microwave probe signal, and wherein the applied microwave pump signal is continuous.

Figure 6:
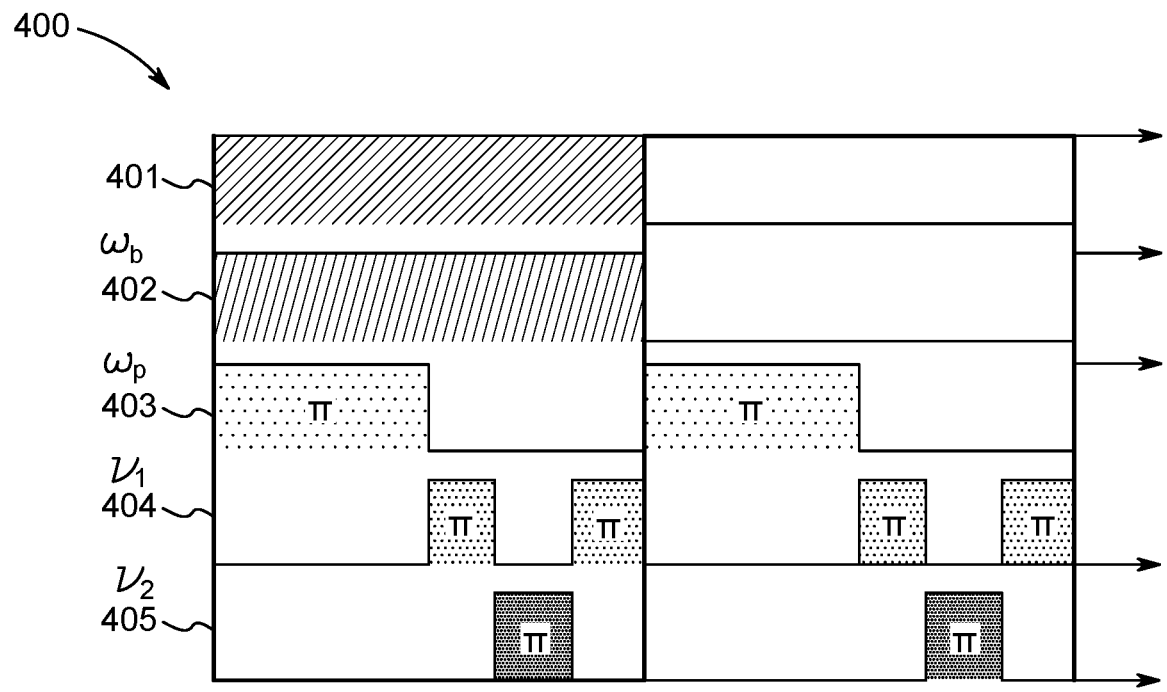
FIG. 6 shows a schematic diagram of an excitation sequence in one embodiment of the presently disclosed atomic clock.

FIG. 6 shows an example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

In one embodiment of the present disclosure the repeated excitation sequence may be ordered and sequentially comprise: 1) a π pulse of the pulsed microwave probe signal; 2) a π pulse of the radiofrequency pump signal 3) a π pulse of the pulsed radiofrequency probe signal, 4) a π pulse of the pump radiofrequency signal; and wherein the laser diode illuminates the diamond-based structure simultaneously with the irradiation of the microwave pump signal at each other repetition of the sequence from 1) to 4).

Figure 7:
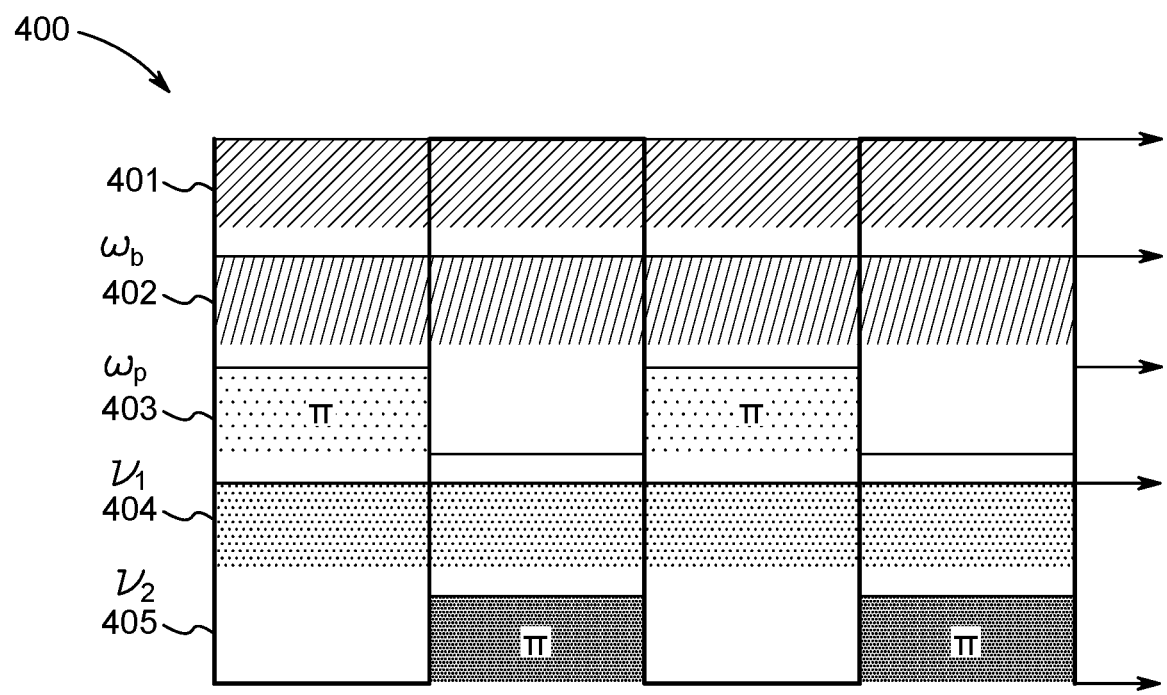
FIG. 7 shows a schematic diagram of an excitation sequence in one embodiment of the presently disclosed atomic clock.

FIG. 7 shows an example of an excitation sequence (400) in one embodiment of the presently disclosed atomic clock: signal (401) is the laser diode illumination; signal (402) is the pump microwave signal; signal (403) is the probe microwave signal; signal (704) is the pump radiofrequency signal; signal (405) is the probe radiofrequency signal.

In one embodiment of the present disclosure the repeated excitation sequence may be ordered and sequentially comprise: 1) a π pulse of the pulsed microwave probe signal; 2) a π pulse of the radiofrequency probe signal; and wherein the laser diode continuously illuminates the diamond-based structure and the microwave pump signal and the radiofrequency pump signals are continuous.

Figure 8:
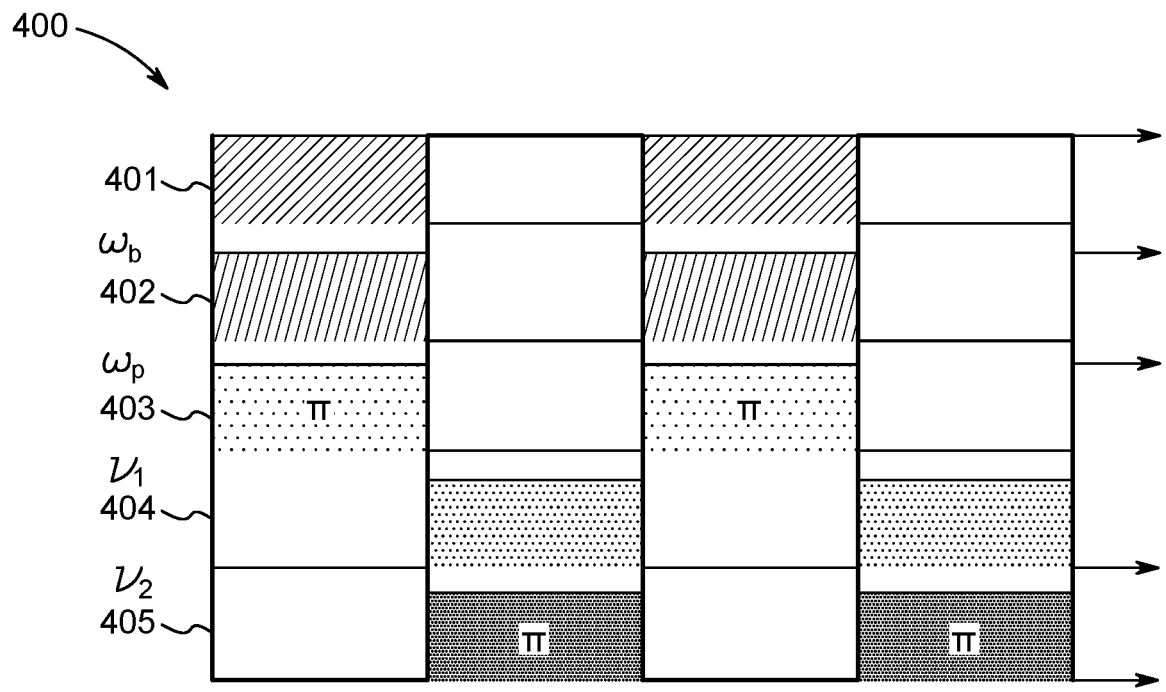
FIG. 8 shows a schematic diagram of an excitation sequence in one embodiment of the presently disclosed atomic clock.

FIG. 8 shows an example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

In one embodiment of the present disclosure the repeated excitation sequence may be ordered and sequentially comprise: 1) a π pulse of the pulsed microwave probe signal; 2) a π pulse of the radiofrequency probe signal; and the laser diode illuminates the diamond-based structure simultaneously with the irradiation of the microwave pump signal, for the duration of the π pulse of the pulsed microwave probe signal, and the radiofrequency pump signal irradiates for the duration of the π pulse of the radiofrequency probe signal.

Figure 9:
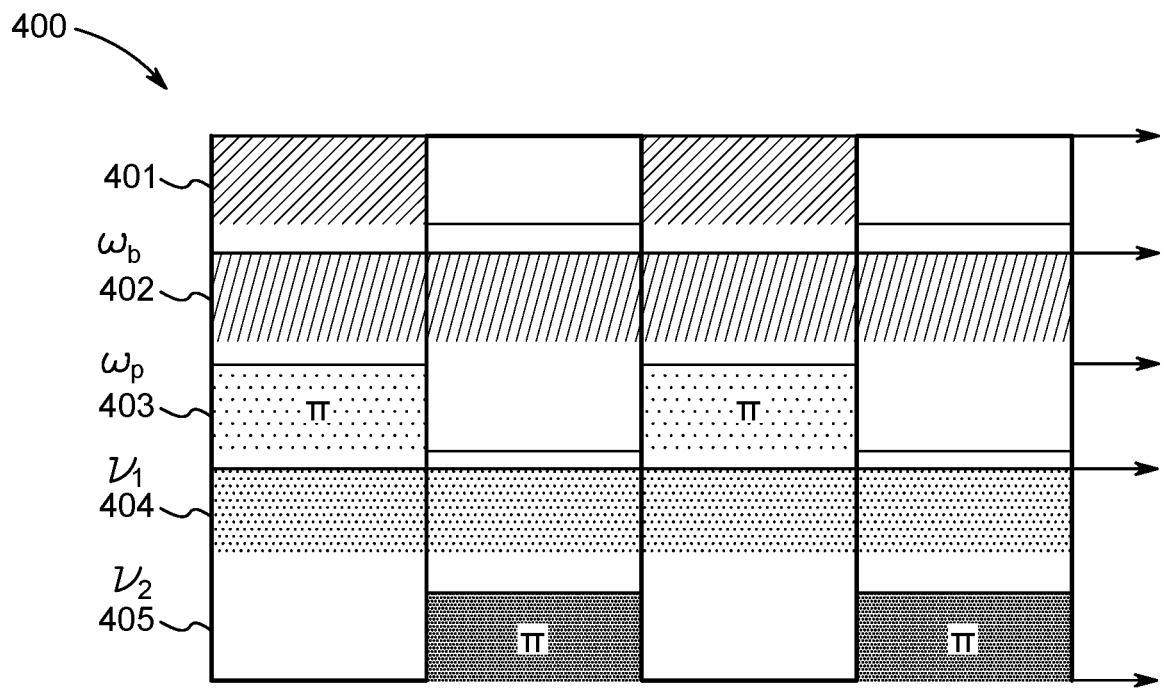
FIG. 9 shows a schematic diagram of an excitation sequence in one embodiment of the presently disclosed atomic clock.

FIG. 9 shows an example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

In one embodiment of the present disclosure the repeated excitation sequence may be ordered and sequentially comprise: 1) a π pulse of the pulsed microwave probe signal; 2) a π pulse of the radiofrequency probe signal; and wherein the laser diode illuminates the diamond-based structure for the duration of the π pulse of the pulsed microwave probe signal, and wherein the microwave pump signal and the radiofrequency pump signal are continuous.

Figure 10:
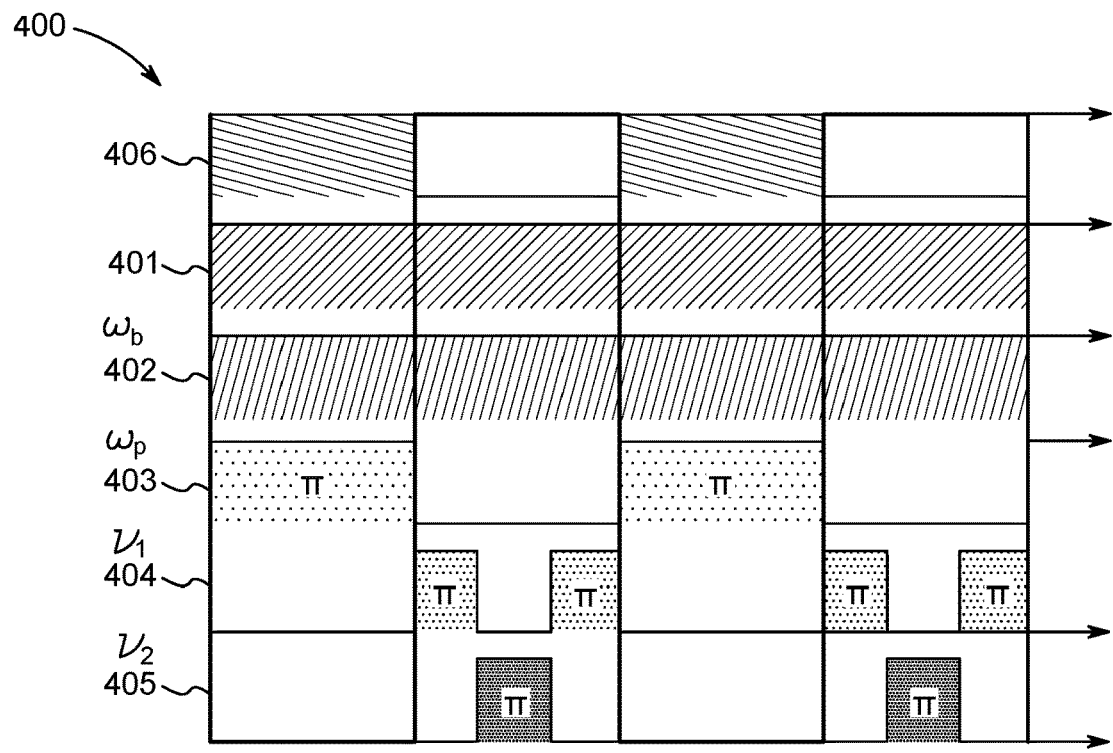
FIG. 10 shows a schematic diagram of an excitation sequence in one embodiment of the presently disclosed atomic clock.

FIG. 10 shows an example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal; signal (406) is the blue diode illumination signal.

In one embodiment of the present disclosure the repeated excitation sequence may be ordered and sequentially comprise: 1) a π pulse of the pulsed microwave probe signal 2) a π pulse of the radiofrequency pump signal 3) a π pulse of the pulsed radiofrequency probe signal, and 4) a π pulse of the radiofrequency pump signal, and wherein the laser diode continuously illuminates the diamond-based structure; and the microwave pump signal is continuous; and the blue diode illuminates the diamond-based structure during the duration of the π pulse of the pulsed microwave probe signal.

Figure 11:
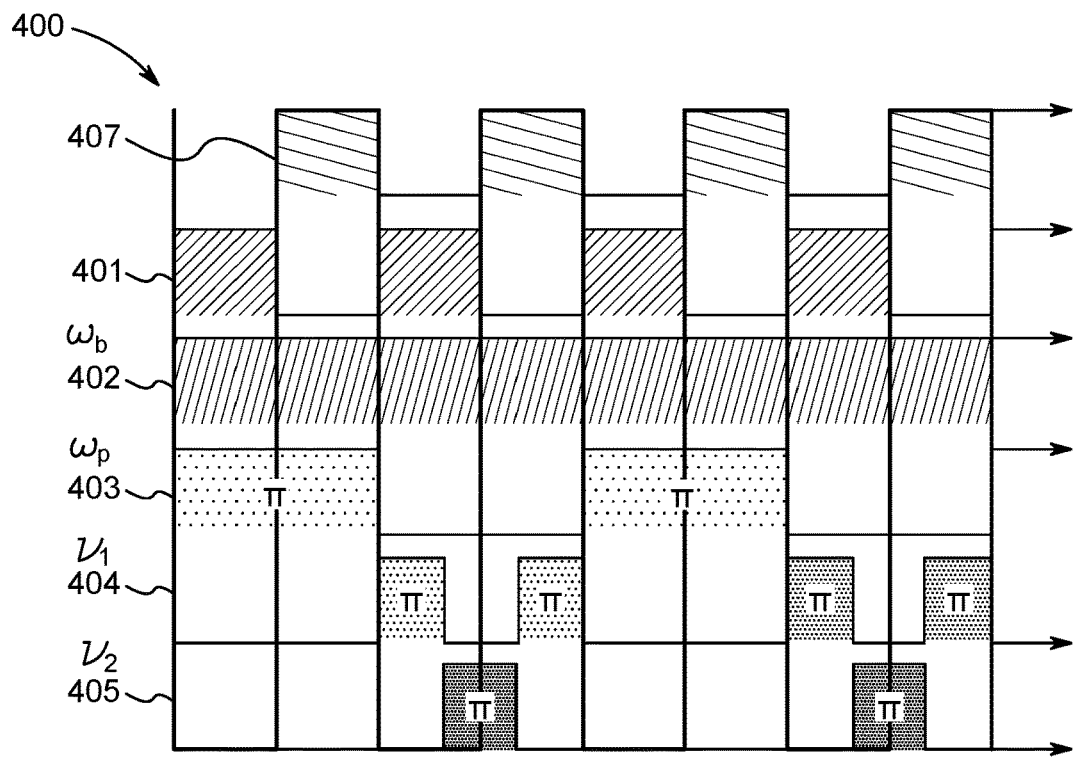
FIG. 11 shows a schematic diagram of an excitation sequence in one embodiment of the presently disclosed atomic clock.

FIG. 11 shows an example of an excitation sequence (400) in one embodiment of the presently disclosed atomic clock: signal (401) is the green diode illumination; signal (402) is the pump microwave signal; signal (403) is the probe microwave signal; signal (404) is the pump radiofrequency signal; signal (405) is the probe radiofrequency signal; signal (407) is the red diode illumination signal.

In one embodiment of the present disclosure the repeated excitation sequence may be ordered and sequentially comprise: 1) a π pulse of the pulsed microwave probe signal 2) a π pulse of the radiofrequency pump signal 3) a π pulse of the pulsed radiofrequency probe signal, and 4) a π pulse of the radiofrequency pump signal; and wherein the microwave pump signal is continuous and the green diode and the red diode alternatively illuminate the diamond-based structure for respective durations of one fourth of the cycle as defined from 1) to 4).

Figure 12:
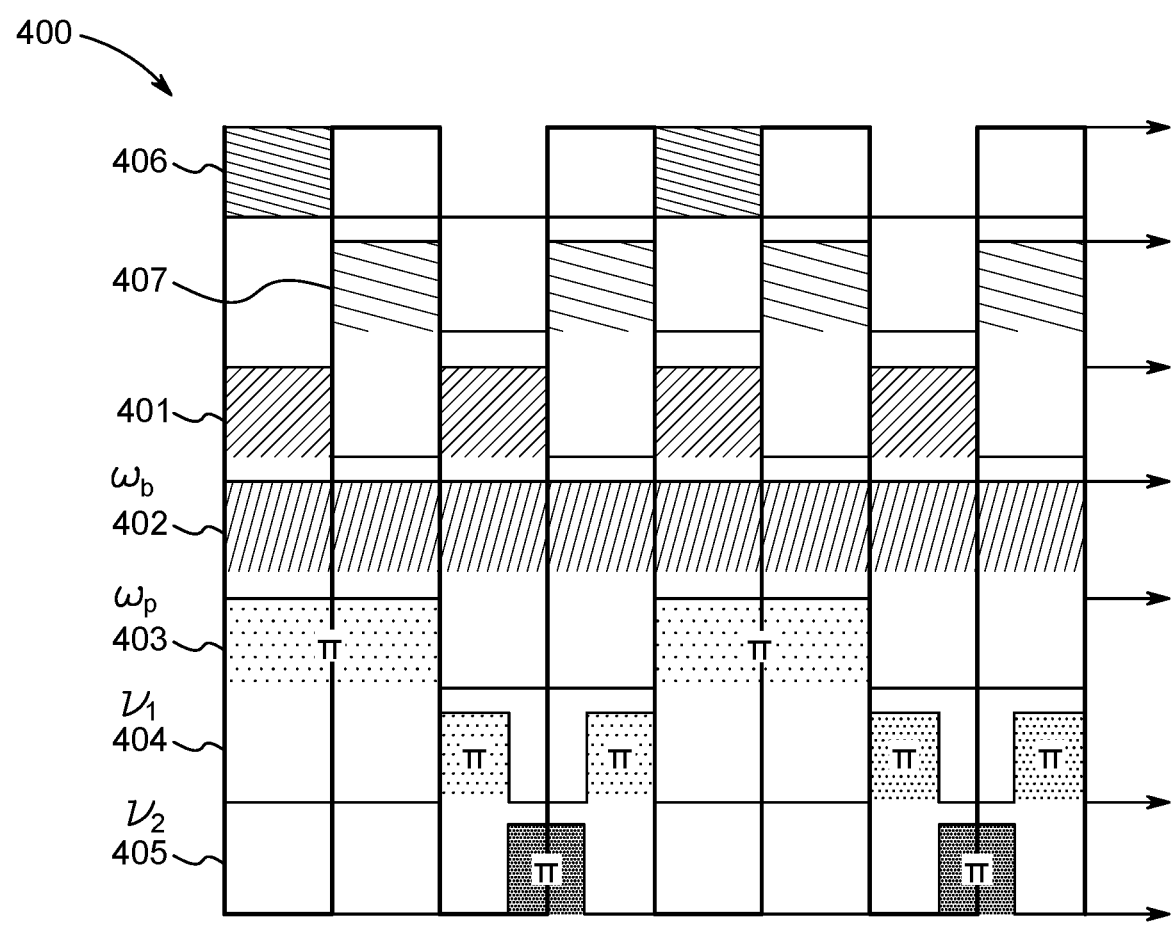
FIG. 12 shows a schematic diagram of an excitation sequence in one embodiment of the presently disclosed atomic clock.

FIG. 12 shows an example of an excitation sequence (400) in one embodiment of the presently disclosed atomic clock: signal (401) is the green diode illumination; signal (402) is the pump microwave signal; signal (403) is the probe microwave signal; signal (404) is the pump radiofrequency signal; signal (405) is the probe radiofrequency signal; signal (406) is the blue diode illumination signal; signal (407) is the red diode illumination signal.

In one embodiment of the present disclosure the repeated excitation sequence may be ordered and sequentially comprise: 1) a π pulse of the pulsed microwave probe signal 2) a π pulse of the radiofrequency pump signal 3) a π pulse of the pulsed radiofrequency probe signal, and 4) a π pulse of the radiofrequency pump signal; and wherein the microwave pump signal is continuous and the green diode and the red diode alternatively illuminate the diamond-based structure for respective durations of one fourth of the cycle as defined from 1) to 4); and wherein the blue diode illuminates the diamond-based structure on every other of the green diode pulses.

Figure 13:
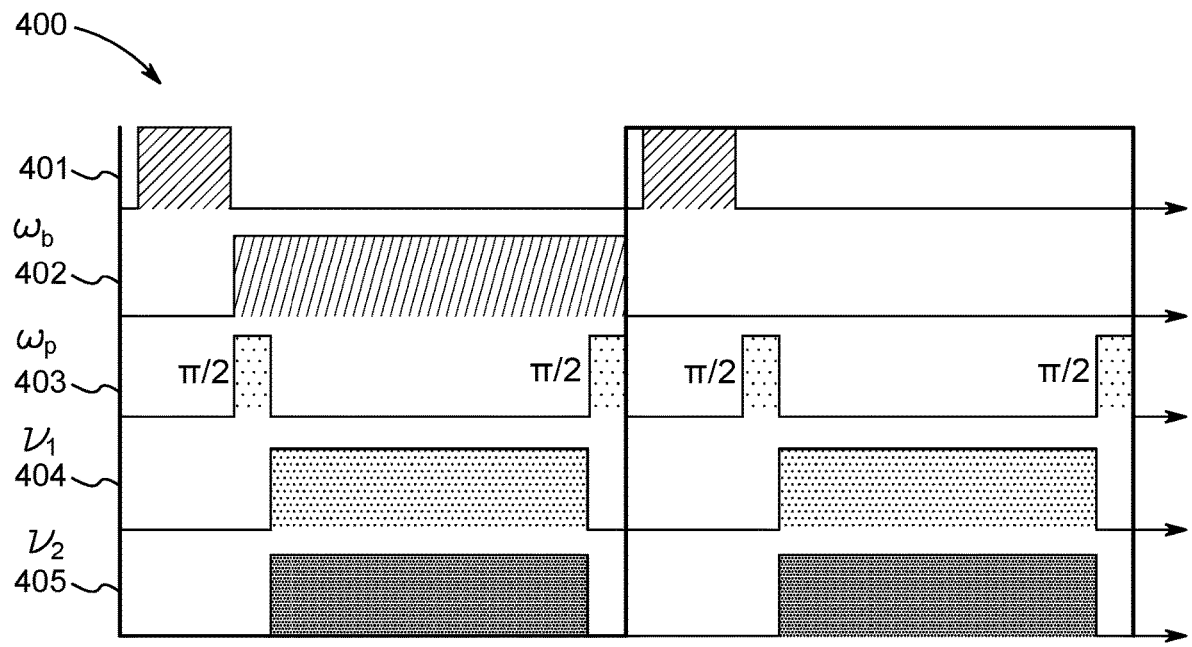
FIG. 13 shows a schematic diagram of an excitation sequence in one embodiment of the presently disclosed atomic clock.

FIG. 13 shows a further example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

Figure 14:
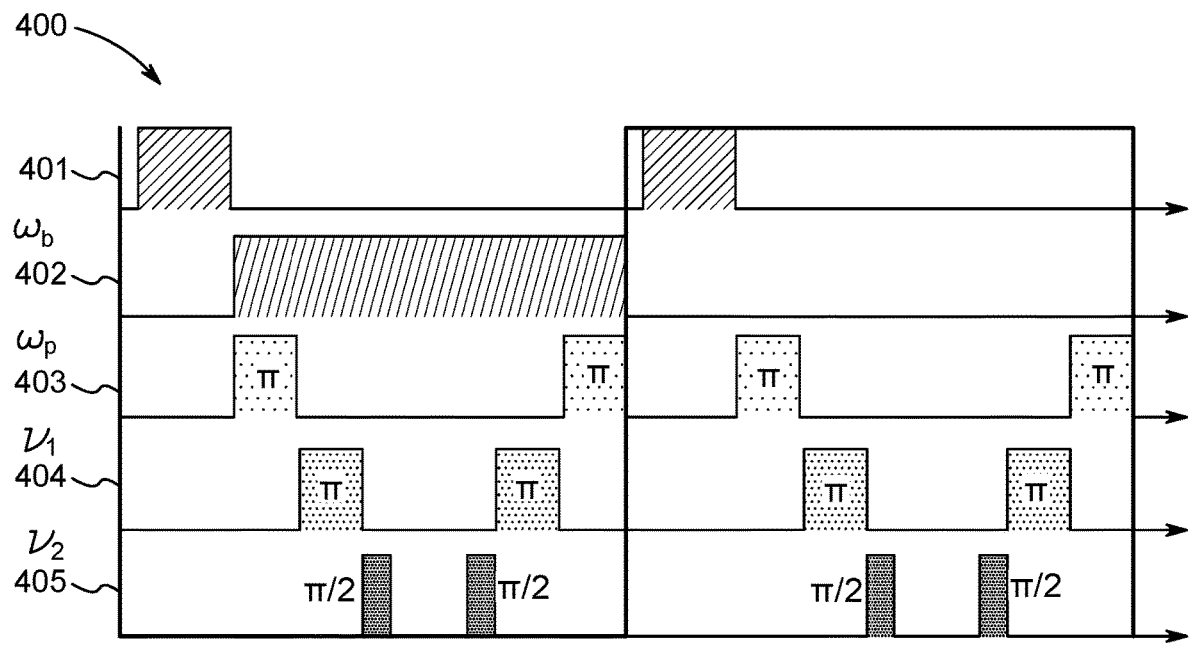
FIG. 14 shows a schematic diagram of an excitation sequence in one embodiment of the presently disclosed atomic clock.

FIG. 14 shows a further example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

Figure 15:
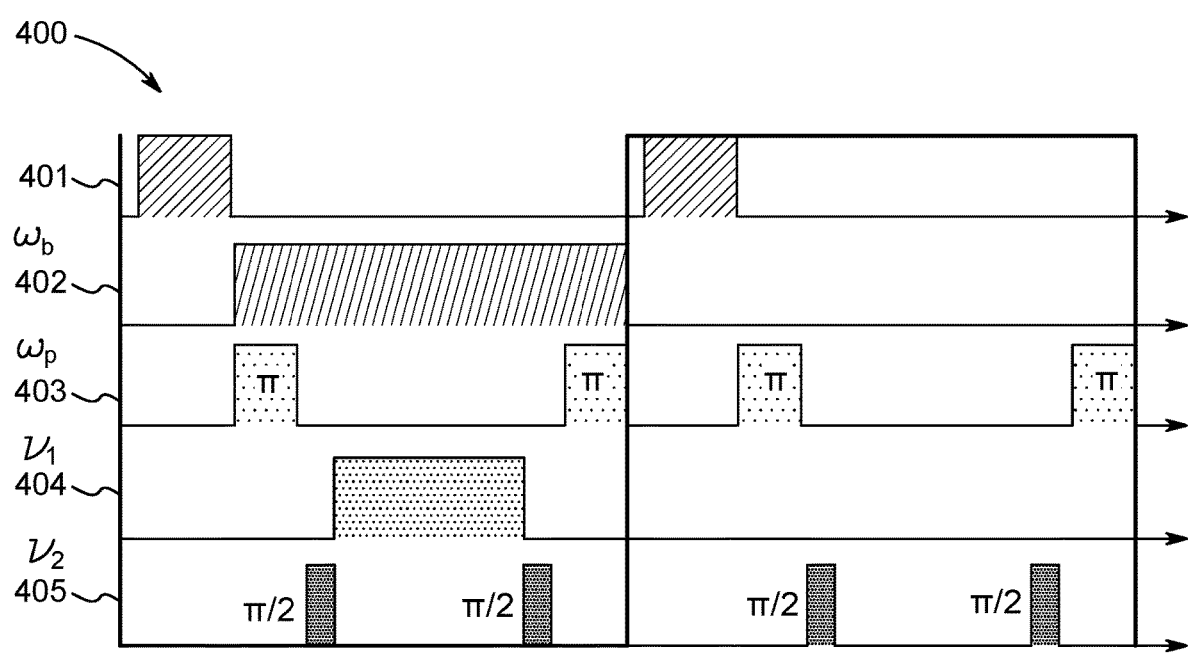
FIG. 15 shows a schematic diagram of an excitation sequence in one embodiment of the presently disclosed atomic clock.

FIG. 15 shows a further example of an excitation sequence (400) in one embodiment of the presently disclosed atomic clock: signal (401) is the laser diode illumination; signal (402) is the pump microwave signal; signal (403) is the probe microwave signal; signal (404) is the pump radiofrequency signal; signal (405) is the probe radiofrequency signal.

Figure 16:
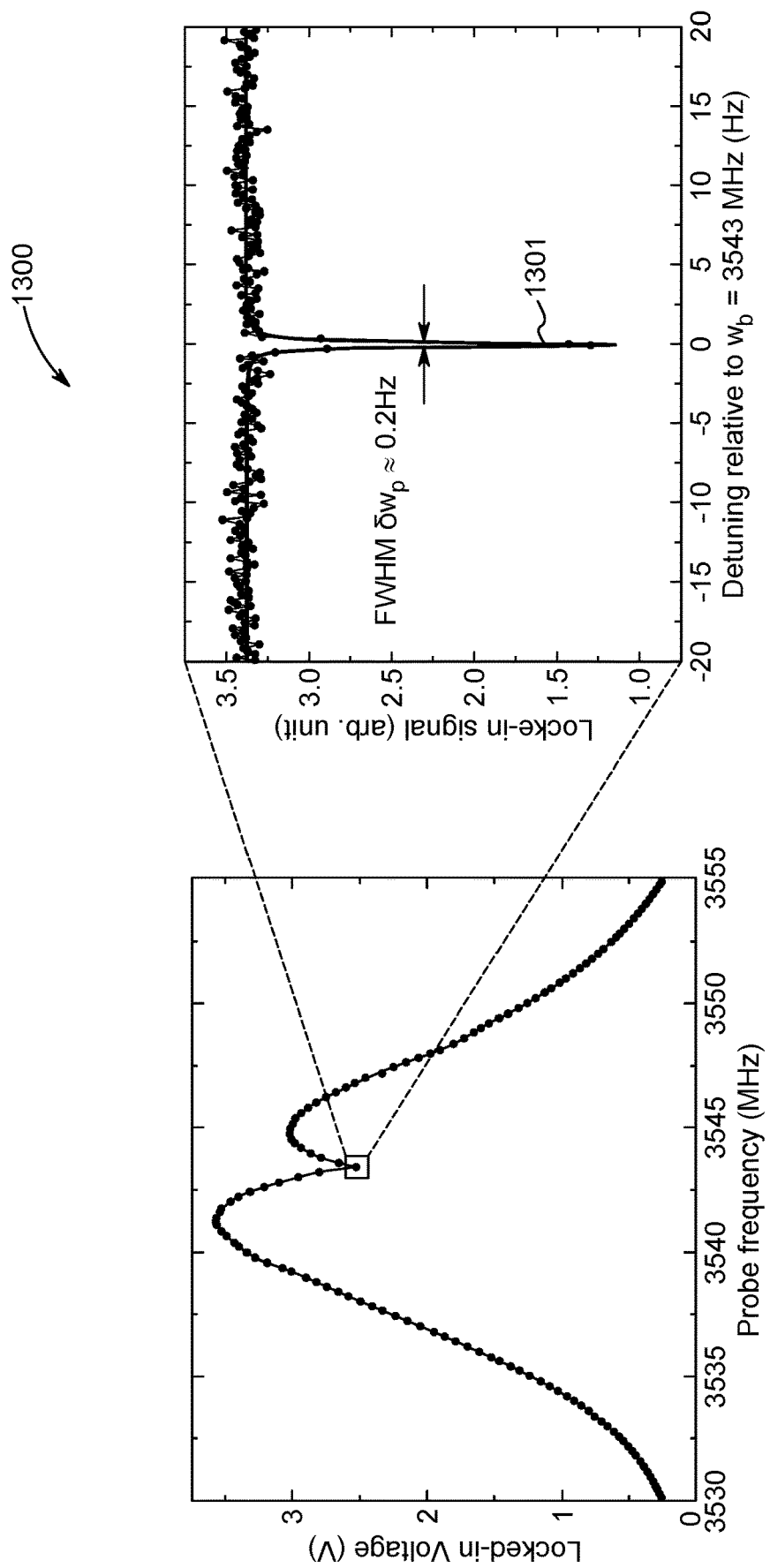
FIG. 16 shows a schematic diagram of the spectral hole response detected by the presently disclosed atomic clock.

Quality of Effective Frequency, Such as an Effective Frequency Corresponding to the Sharp Spectral Feature FIG. 16 shows a schematic diagram of the spectral hole response detected by the presently disclosed atomic clock. In this example the detuning, that is the full width at half maximum of the response in the burnt hole is of 0.2 Hz for an effective frequency, such as an effective frequency corresponding to the sharp spectral feature, of 3.543 GHz.

Due to the properties of the diamond-based structure, an effective frequency of the presently disclosed atomic clock may depend on the application of a DC magnetic field. The inventors realize that different effective frequencies may be achieved by application of a DC magnet of different amplitude and direction.

In one embodiment of the presently disclosed atomic clock, the effective frequency, such as an effective frequency corresponding to the sharp spectral feature, $\omega_p$ may be between 2 and 4 GHZ, preferably 2.869 GHz in absence of DC magnet, and the full width at half maximum $\delta\omega_p$ around the effective frequency may be less than a Hz, and other effective frequencies, preferably within the GHz range, may be obtained by different excitations and different diamond structures and/or in presence of a DC magnet.

In one embodiment of the present disclosure, a ratio between the full width at half maximum $\delta\omega_p$ around the effective frequency and the effective frequency $\omega_p$ may be less than $10^{-9}$, preferably less than $10^{-10}$, more preferably less than $10^{-12}$.

In one embodiment of the present disclosure, a frequency of the microwave pump signal may be comprised between 2 and 4 GHZ, preferably 2.869 GHz in absence of a DC magnet, and the microwave probe signal may be detuned from the continuous microwave pump signal by 1 to 10 kHz, preferably 5 kHz.

In one embodiment of the present disclosure a frequency of the radiofrequency pump signal and/or the frequency of the radiofrequency probe signal may be comprised between 2 and 10 MHz. The pump and probe radiofrequency signals may be detuned between each other by, for example, 1 MHz to 10 MHz.

Physics of the Diamond-Based Structure Under Excitation

Spectral hole burning is a spectroscopic technique used to study the broadening mechanism and intrinsic properties underlying non-Lorentzian broadened spectral features. For diamond-based structures with nitrogen-vacancy defect ensembles, spectral hole burning of the broadened electron spin transitions can be carried out by applying two microwave fields, and a response detected via the diamond's light absorption as a function of the relative detuning of the two microwave field frequencies.

A narrow spectral hole may be obtained by driving both the electron and nuclear spin transitions. An example of such a spectral hole is shown in FIG. 16, with a full width at half maximum of 0.2 Hz, around an effective frequency of 3.543 GHz.

The NV$^-$ defects electronic structure comprises a ground state with three electron spin states $|m_S=0, \pm1\rangle$. Each electron spin state is further comprised of hyperfine-coupled nuclear spin states $|m_I=0, \pm1\rangle$. Each of the above nuclear spin states may have an in-homogeneously broadened energy spectrum, at room temperature. Green laser illumination excites the electrons of the diamond-based structure from a ground state to an excited state, which can then decay again to the ground state from the excited state, both directly and via a shelving state. These state transitions may happen continuously. Pump and probe microwave frequencies may be applied to either ground state electron transitions $m_S$: $|0\rangle\leftrightarrow|+1\rangle$, or $|0\rangle\leftrightarrow|-1\rangle$. Subsequently, radiofrequency pump and probe field frequencies may be used to drive the associated nuclear spin state transitions $m_I$: $|0\rangle\leftrightarrow|+1\rangle$, or $|0\rangle\leftrightarrow|-1\rangle$. The application of different excitation sequences trigger different electron and nuclear spin transition orders, which can be used to manage different levels of signal-to-noise ratio and/or contrast and or amplitude of the detected response.

Figure 17:
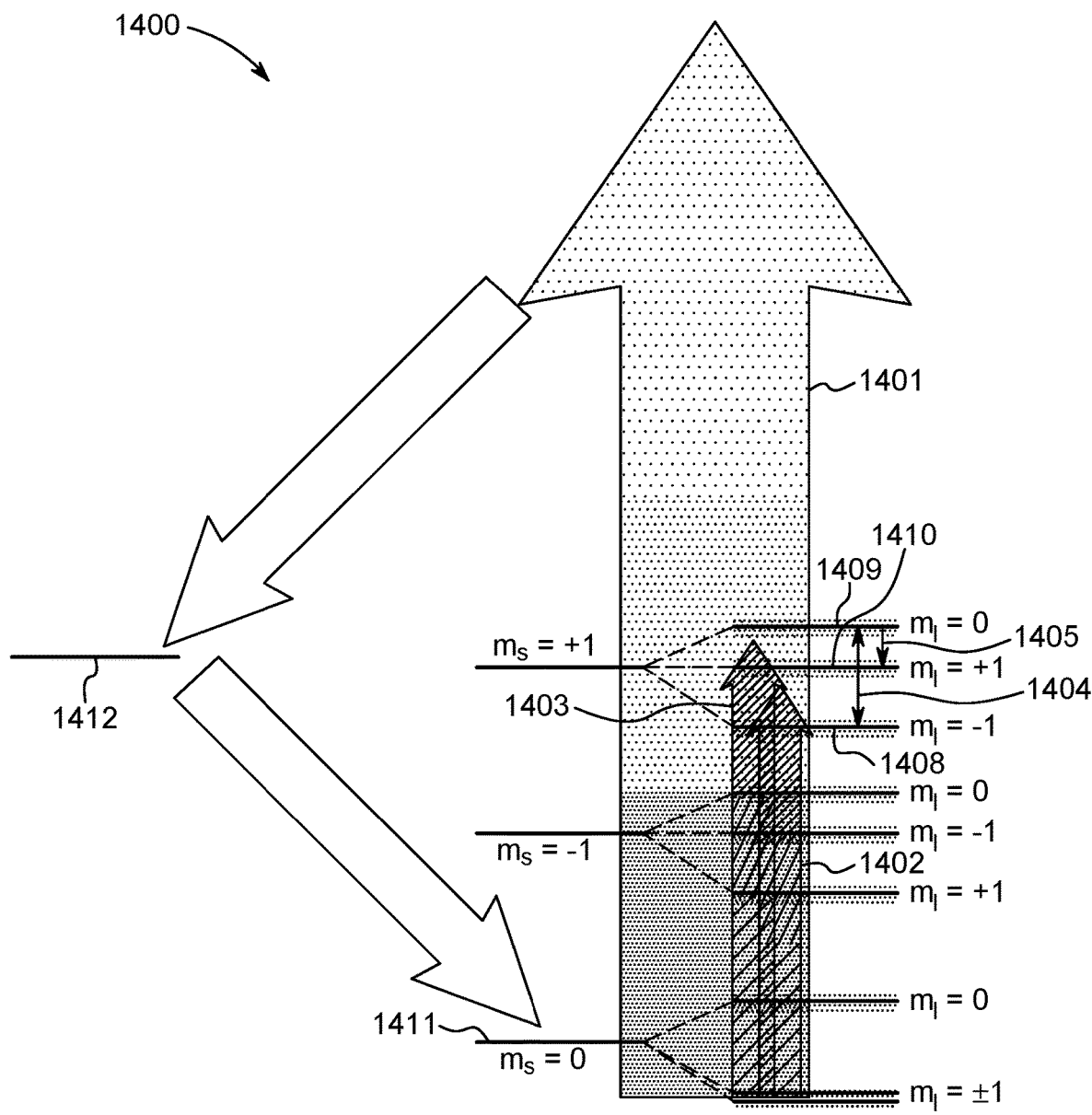
FIG. 17 shows a schematic diagram of an example of the physical process in the diamond-based structure.

FIG. 17 shows a schematic diagram of an example of the physical process (1400) in the diamond-based structure. A green laser (1401) excites electrons from their ground state spin manifold (1411, 1408, 1410, 1403), and a microwave pump (1402) and probe (1403) are used to excite electrons into the nuclear spin state manifold of (1409) of the ground state $|m_S=+1\rangle$. Radiofrequency pump signal (1404,1405) is used to drive the nuclear spin state transitions $|m_I=0\rangle\leftrightarrow|m_I=\pm1\rangle$ (1408,1410). A shelving-state 1412 enables electron spin polarization into a ground state under continuous optical excitation.

The physical process described in (1400) is related to the excitation sequences with only green laser diode and comprising at least a π pulse of the radiofrequency pump signal, as for the excitation sequences shown in FIG. 4 to FIG. 6.

Figure 18:
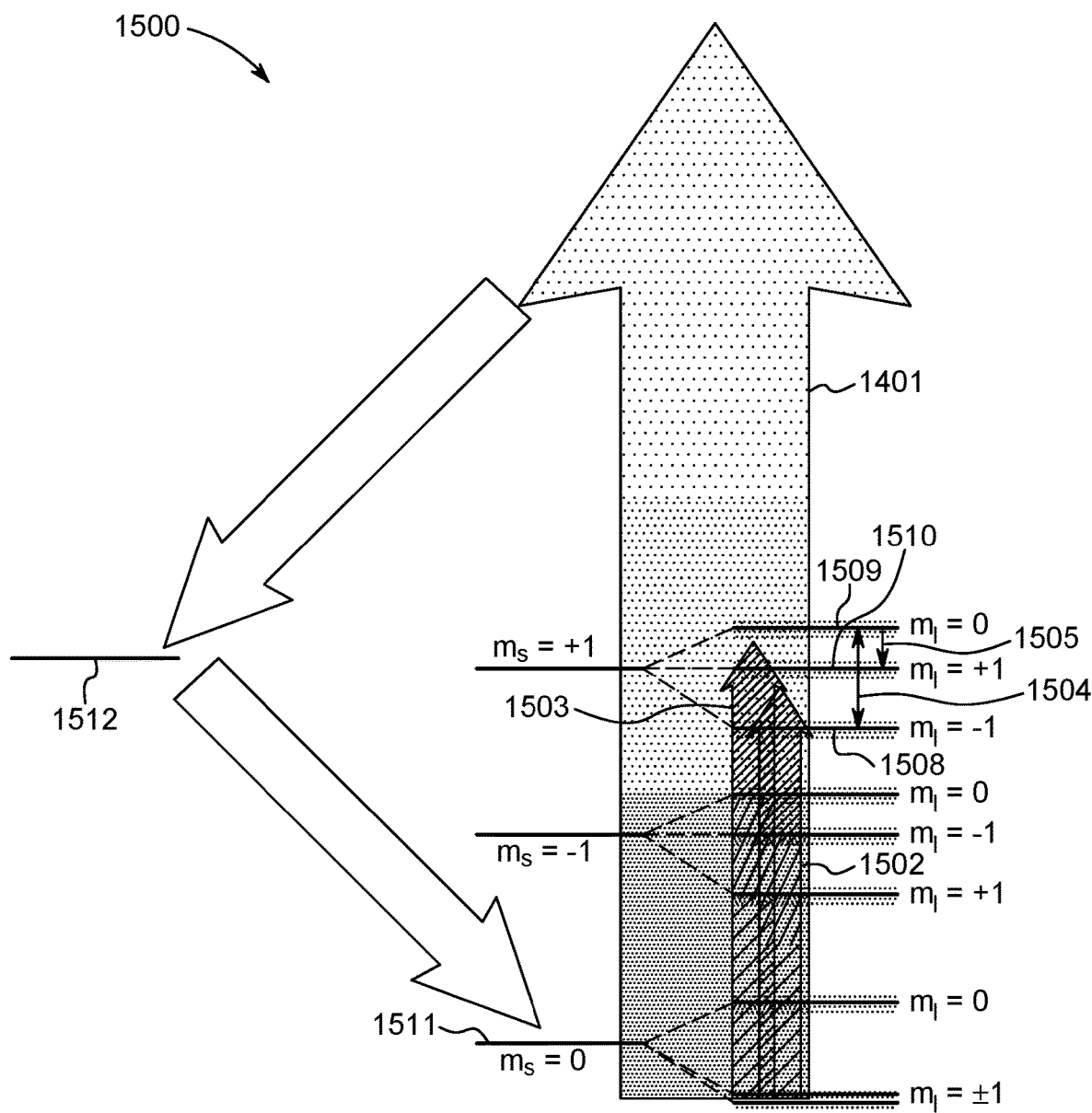
FIG. 18 shows a schematic diagram of an example of the physical process in the diamond-based structure.

FIG. 18 shows a schematic diagram of an example of the physical process (1500) in the diamond-based structure. A green laser (1501) excites electrons from their ground state spin manifold (1509, 1510, 1511), and microwave pump (1502) and probe (1503) are used to excite electrons into the nuclear spin state manifold of the ground state $|m_S=+1\rangle$. A radiofrequency pump signal (1504) and probe signal (1505) is used to drive the nuclear spin state transition $|m_I=0\rangle\leftrightarrow|m_I=+1\rangle$ (1510). A shelving-state 1512 enables electron spin polarization into a ground state under continuous optical excitation.

The physical process described in (1500) is related to the excitation sequences with only green laser diode and comprising at least a π pulse of the radiofrequency probe signal, whereas the radiofrequency pump signal is either continuous of irradiating only during the π pulse of the radiofrequency probe signal, as for the excitation sequences shown in FIG. 7 to FIG. 9.

In excitation sequences using the blue and/or the red laser diodes, a NV-charge state of the nitrogen-vacancy defects is maintained.

It is to be understood that the presently disclosed method may be carried out using the presently disclosed atomic clock. The presently disclosed atomic clock is suitable for carrying out the presently disclosed method.

Further Details

1. A time keeping device comprising:
   a solid state crystal with electromagnetic resonance frequencies;
   at least one light emitting diode configured to illuminate the solid state crystal;
   a microwave pump generator configured to generate a microwave pump signal;
   a microwave probe generator configured to generate a pulsed microwave probe signal;
   a radiofrequency pump generator configured to generate a radiofrequency pump signal;
   a radiofrequency probe generator configured to generate a pulsed radiofrequency probe signal;
   one or more transmission lines or an antenna structure to feed the microwave pump signal, the pulsed microwave probe signal, the radiofrequency pump signal and the pulsed radiofrequency probe signal to the solid state crystal; and
   a detector configured to detect a response from the solid state crystal, wherein a frequency spectrum of said response comprises a sharp spectral response; and
   wherein the time keeping device is configured to generate a time dependent signal, based on the sharp spectral response.
2. An atomic clock comprising:
   a diamond-based structure with nitrogen-vacancy defects and nitrogen-vacancy clusters;
   at least one green laser diode configured to illuminate the diamond-based structure;
   a microwave pump generator configured to generate a microwave pump signal;
   a microwave probe generator configured to generate a pulsed microwave probe signal;
   a radiofrequency pump generator configured to generate a radiofrequency pump signal;
   a radiofrequency probe generator configured to generate a pulsed radiofrequency probe signal;
   one or more transmission lines or an antenna structure to feed the microwave pump signal, the pulsed microwave probe signal, the radiofrequency pump signal and the pulsed radiofrequency probe signal to the diamond-based structure; and
   a detector configured to detect a response from the diamond-based structure, wherein a frequency spectrum of said response comprises a sharp spectral feature; and
   wherein the atomic clock is configured to generate an output clock signal, based on the sharp spectral feature.
3. The atomic clock or device according to any of the preceding items, wherein the diamond-based structure comprises magnetically resonant defects such as nitrogen-vacancy defects.
4. The atomic clock or device according to any one of the preceding items, wherein the sharp spectral feature of the response from the diamond-based structure is generated using multiple frequency signals;
5. The atomic clock or device according to any one of the preceding items, wherein the sharp spectral feature is based on burnt spectral holes, a population oscillation spike, and/or electromagnetically induced transparencies.
6. The atomic clock or device according to any one of the preceding items, wherein the diamond-based structure is a uniform diamond membrane, or a strained photonic crystal membrane, or a modulated defect composition obtained via chemical vapor deposition (CVD) growth, or a disk obtained by etching or cutting a diamond, or any other diamond-based crystalline structure with magnetically resonant defects, such as nitrogen-vacancy defects.
7. The atomic clock or device according to any one of the preceding items, further comprising at least one blue and/or at least one red laser diode, configured to illuminate the diamond-based structure.
8. The atomic clock or device according to any one of the preceding items, wherein the one or more transmission lines comprises a single or multiple coplanar waveguide arranged underneath, or deposited on a lower surface of, the diamond-based structure.
9. The atomic clock or device according to any one of the preceding items, wherein the diamond-based structure is not p-doped and the diamond-based structure is not n-doped and the surface of the diamond-based structure is not p-doped nor n-doped, such that the diamond-based structure does not suffer from generation of dark currents.
10. The atomic clock or device according to any one of the preceding items, wherein the diamond-based structures surface is oxygen terminated, and specifically surface termination is predominantly bridge-bonded ether groups such that the diamond-based structures surface does not induce dark current noise.
11. The atomic clock or device according to any one of the preceding items, wherein the detector comprises at least one pair of interdigitated electrodes, configured to detect a photocurrent response from the diamond-based structure.
12. The atomic clock or device according to item 11, wherein the pair of interdigitated electrodes is arranged in direct contact with a surface of the diamond-based structure.
13. The atomic clock or device according to any one of the preceding items, wherein the microwave probe and pump signals excite electron spin transitions energy levels in the diamond-based structure.
14. The atomic clock or device according to any one of the preceding items, wherein the radiofrequency probe and pulse signals excite nuclear spin transition energy levels in the diamond-based structure.
15. The atomic clock or device according to any one of the preceding items, wherein a density of nitrogen-vacancy defects is of at least 5 parts per million, preferably at least 10 parts per million, more preferably at least 20 parts per million, and the density of nitrogen-vacancy defects is less than 100 parts per million.
16. The atomic clock according to any one of the preceding items, wherein, a density of nitrogen-vacancy clusters is of at least 1 parts per million, preferably at least 4 parts per million, more preferably at least 7 parts per million.
17. The atomic clock or device according to any one of the preceding items, wherein the atomic clock is configured to provide an excitation sequence of the microwave and radiofrequency pump and probe signals that is optimized to obtain a sharp spectral feature based on burnt spectral holes, a population oscillation spike, and/or electromagnetically induced transparency response comprising the effects of the electron spin transitions and the nuclear spin transitions of the diamond-based structure.

18. The atomic clock or device according to any one of the preceding items, further comprising a phase locked loop configured to lock the microwave pump signal to an effective frequency corresponding to the sharp spectral feature.

19. The atomic clock or device according to item 18, further comprising a lock-in detection circuit for sensing the response, such as a photocurrent, wherein the lock-in detection circuit is coupled to the phase locked loop 20. The atomic clock or device according to any one of the preceding items, further comprising a frequency divider configured to generate a clock frequency from a frequency division of an effective frequency corresponding to the sharp spectral feature.

21. The atomic clock or device according to any one of the preceding items, wherein the laser diodes, the microwave pump and probe generators and the radiofrequency pump and probe generators are configured to generate a repeated excitation sequence.

22. The atomic clock or device according to item 21, wherein the repeated excitation sequence comprises at least one π pulse of the probe microwave signal and/or at least one π pulse of the radiofrequency probe signal.

23. The atomic clock or device according to item 21, wherein, in the repeated excitation sequence, one π pulse of the probe microwave signal precedes one π pulse of the radiofrequency probe signal.

24. The atomic clock or device according to item 21, wherein, in the repeated excitation sequence, pulses from a green laser diode are alternated to pulses from a red laser diode.

25. The atomic clock or device according to item 21, wherein, in the repeated excitation sequence, pulses from a blue laser diode are simultaneous to every other pulse of a green laser diode.

26. The atomic clock or device according to item 21, wherein, in the repeated excitation sequence, the microwave pump signal is continuous or pulsed at alternative effective durations, and wherein an effective duration comprises at least one π pulse of the probe microwave signal.

27. The atomic clock or device according to item 21, wherein, in the repeated excitation sequence, the microwave pump signal is continuous or pulsed at alternative effective durations, and wherein an effective duration comprises at least one π pulse of the radiofrequency pump signal and at least one π pulse of the pump radiofrequency signal.

28. The atomic clock or device according to item 21, wherein the repeated excitation sequence comprises at least one π pulse of the pulsed microwave probe signal, and/or at least one π pulse of the radiofrequency pump signal, and/or at least one π pulse of the pulsed radiofrequency probe signal.

29. The atomic clock or device according to item 21, wherein the repeated excitation sequence is ordered and sequentially comprises: 1) a π pulse of the pulsed microwave probe signal 2) a π pulse of the radiofrequency pump signal 3) a π pulse of the pulsed radiofrequency probe signal, and 4) a π pulse of the pump radiofrequency signal, and wherein the green diode is continuously illuminating the diamond-based structure and the applied microwave pump signal is continuous.

30. The atomic clock or device according to item 21, wherein the repeated excitation sequence is ordered and sequentially comprises: 1) a π pulse of the pulsed microwave probe signal; 2) a π pulse of the radiofrequency pump signal 3) a π pulse of the pulsed radiofrequency probe signal, 4) a π pulse of the pump radiofrequency signal; and wherein the green diode is illuminating the diamond-based structure only for the duration of the π pulse of the pulsed microwave probe signal, and wherein the applied microwave pump signal is continuous.

31. The atomic clock or device according to item 21, wherein the repeated excitation sequence is ordered and sequentially comprises: 1) a π pulse of the pulsed microwave probe signal; 2) a π pulse of the radiofrequency pump signal 3) a π pulse of the pulsed radiofrequency probe signal, 4) a π pulse of the pump radiofrequency signal; and wherein the green diode illuminates the diamond-based structure simultaneously with the irradiation of the microwave pump signal at each other repetition of the sequence from 1) to 4).

32. The atomic clock or device according to item 21, wherein the repeated excitation sequence is ordered and sequentially comprises: 1) a π pulse of the pulsed microwave probe signal; 2) a π pulse of the radiofrequency probe signal; and wherein the green diode continuously illuminates the diamond-based structure and the microwave pump signal and the radiofrequency pump signals are continuous.

33. The atomic clock or device according to item 21, wherein the repeated excitation sequence is ordered and sequentially comprises: 1) a π pulse of the pulsed microwave probe signal; 2) a π pulse of the radiofrequency probe signal; and the green diode illuminates the diamond-based structure simultaneously with the irradiation of the microwave pump signal, for the duration of the π pulse of the pulsed microwave probe signal, and the radiofrequency pump signal irradiates for the duration of the π pulse of the radiofrequency probe signal 34. The atomic clock or device according to item 21, wherein the repeated excitation sequence is ordered and sequentially comprises: 1) a π pulse of the pulsed microwave probe signal; 2) a π pulse of the radiofrequency probe signal; and wherein the green diode illuminates the diamond-based structure for the duration of the π pulse of the pulsed microwave probe signal, and wherein the microwave pump signal and the radiofrequency pump signal are continuous.

35. The atomic clock or device according to item 21, wherein the repeated excitation sequence is ordered and sequentially comprises: 1) a π pulse of the pulsed microwave probe signal 2) a π pulse of the radiofrequency pump signal 3) a π pulse of the pulsed radiofrequency probe signal, and 4) a π pulse of the radiofrequency pump signal, and wherein the green diode continuously illuminates the diamond-based structure; and the microwave pump signal is continuous; and the blue diode illuminates the diamond-based structure during the duration of the π pulse of the pulsed microwave probe signal.

36. The atomic clock or device according to item 21, wherein the repeated excitation sequence is ordered and sequentially comprises: 1) a π pulse of the pulsed microwave probe signal 2) a π pulse of the radiofrequency pump signal 3) a π pulse of the pulsed radiofrequency probe signal, and 4) a π pulse of the radiofrequency pump signal; and wherein the microwave pump signal is continuous and the green diode and the

21 red diode alternatively illuminates the diamond-based structure for respective durations of one fourth of the cycle as defined from 1) to 4)).

37. The atomic clock or device according to item 21, wherein the repeated excitation sequence is ordered and sequentially comprises: 1) a π pulse of the pulsed microwave probe signal 2) a π pulse of the radiofrequency pump signal 3) a π pulse of the pulsed radiofrequency probe signal, and 4) a π pulse of the radiofrequency pump signal; and wherein the microwave pump signal is continuous and the green diode and the red diode alternatively illuminate the diamond-based structure for respective durations of one fourth of the cycle as defined from 1) to 4); and wherein the blue diode illuminates the diamond-based structure on every other of the green diode pulses.

38. The atomic clock or device according to any one of the preceding items, further comprising a ceramic chip carrying the diodes, the transmission lines or the antenna structure and the diamond-based structure, and the detector.

39. The atomic clock or device according to 38, wherein the phase locked loop, the lock-in detection circuit, the microwave generators and the radiofrequency generators are external to the ceramic chip.

40. The atomic clock or device according to any one of the preceding items, wherein the an effective frequency corresponding to the sharp spectral feature $\omega_p$ is between 2 and 4 GHZ, preferably 2.869 GHz in absence of DC magnet, and the full width at half maximum $\delta\omega_p$ around the effective frequency is less than 1 Hz and wherein other effective frequencies, preferably within the GHz range, are obtained by different excitations and different diamond structures and/or in presence of a DC magnet.

41. The atomic clock or device according to any one of the preceding items, wherein a ratio between the full width at half maximum $\delta\omega_p$ around an effective frequency corresponding to the sharp spectral feature and the effective frequency $\omega_p$ is less than $10^{-9}$, preferably less than $10^{-10}$, more preferably less than $10^{-12}$.

42. The atomic clock or device according to any one of the preceding items, wherein a frequency of the microwave pump signal is comprised between 2 and 4 GHZ, preferably 2.869 GHz in absence of a DC magnet, and wherein the microwave probe signal is detuned from the microwave pump signal by 1 to 10 kHz, preferably 5 kHz.

43. The atomic clock or device according to any one of the preceding items, wherein the microwave pump signal and the microwave probe signal coexist in the transmission line.

44. The atomic clock or device according to any one of the preceding items, wherein the frequency of the radiofrequency pump signal and/or the frequency of the radiofrequency probe signal is comprised between 2 and 8 MHz.

45. The atomic clock or device according to any one of the preceding items, wherein the radiofrequency pump signal and the radiofrequency probe signal coexist in the transmission line.

46. A method for generating a clock signal, the method comprising the steps of:
illuminating a diamond-based structure with nitrogen-vacancy defects and nitrogen-vacancy clusters with at least a green diode.

22 generating a microwave pump signal;
generating a pulsed microwave probe signal;
generating a radiofrequency pump signal;
generating a pulsed radiofrequency probe signal;
feeding the microwave pump signal, the pulsed microwave probe signal, the radiofrequency pump signal and the pulsed radiofrequency probe signal to the diamond-based structure;
obtaining a response from the diamond-based structure, wherein a frequency spectrum of said response comprises a sharp spectral feature; and
generating an output clock signal based on said sharp spectral feature.

47. The method according to item 46, wherein the sharp spectral feature of the response from the diamond-based structure is generated using multiple frequency signals;

48. The atomic clock according to any one items 46-47, wherein the sharp spectral feature is based on burnt spectral holes, a population oscillation spike, and/or electromagnetically induced transparencies.

49. The method according to any one of items 46-48 using the atomic clock according to any one of items 1-45.

The invention claimed is:

1. An atomic clock device comprising:
a diamond-based structure with nitrogen-vacancy defects and nitrogen-vacancy clusters;
at least one light emitting diode configured to illuminate the diamond-based structure;
a microwave pump generator configured to generate a microwave pump signal;
a microwave probe generator configured to generate a pulsed microwave probe signal;
a radiofrequency pump generator configured to generate a radiofrequency pump signal;
a radiofrequency probe generator configured to generate a pulsed radiofrequency probe signal;
one or more transmission lines or an antenna structure to feed the microwave pump signal, the pulsed microwave probe signal, the radiofrequency pump signal and the pulsed radiofrequency probe signal to the diamond-based structure; and
a detector configured to detect a response from the diamond-based structure in response to the microwave pump signal, the pulsed microwave probe signal, the radiofrequency pump signal and the pulsed radiofrequency probe signal, wherein a frequency spectrum of said response comprises a sharp spectral feature; and
wherein the atomic clock device is configured to generate an output clock signal, based on the sharp spectral feature.

2. The atomic clock device according to claim 1, wherein the sharp spectral feature is based on burnt spectral holes, a population oscillation spike, and/or electromagnetically induced transparencies.

3. The atomic clock device according to claim 1, wherein the diamond-based structure is a uniform diamond membrane, or a strained photonic crystal membrane, or a modulated defect composition obtained via chemical vapor deposition (CVD) growth, or a disk obtained by etching or cutting a diamond, or any other diamond-based crystalline structure with magnetically resonant defects, such as nitrogen-vacancy defects.

4. The atomic clock device according to claim 1, wherein the one or more transmission lines comprises a single or multiple coplanar waveguide arranged underneath, or deposited on a lower surface of, the diamond-based structure.

5. The atomic clock device according to claim 1, wherein the diamond-based structure is not p-doped and the diamond-based structure is not n-doped and the surface of the diamond-based structure is not p-doped nor n-doped, such that the diamond-based structure does not suffer from generation of dark currents.

6. The atomic clock device according to claim 1, wherein the diamond-based structures surface is oxygen terminated, and specifically surface termination is predominantly bridge-bonded ether groups such that the diamond-based structures surface does not induce dark current noise.

7. The atomic clock device according to claim 1, wherein the detector comprises at least one pair of interdigitated electrodes, configured to detect a photocurrent response from the diamond-based structure.

8. The atomic clock device according to claim 7, wherein the pair of interdigitated electrodes is arranged in direct contact with a surface of the diamond-based structure.

9. The atomic clock device according to claim 1, wherein the microwave probe and pump signals excite electron spin transitions energy levels in the diamond-based structure.

10. The atomic clock device according to claim 1, wherein the radiofrequency probe and pulse signals excite nuclear spin transition energy levels in the diamond-based structure.

11. The atomic clock device according to claim 1, wherein the atomic clock is configured to provide an excitation sequence of the microwave and radiofrequency pump and probe signals that is optimized to obtain a sharp spectral feature based on burnt spectral holes, a population oscillation spike, and/or electromagnetically induced transparency response comprising the effects of the electron spin transitions and the nuclear spin transitions of the diamond-based structure.

12. The atomic clock device according to claim 1, wherein the pulsed microwave probe signal, the radiofrequency pump signal and the pulsed radiofrequency probe signal are modulated at a frequency equal to or a function of a reference frequency.

13. The atomic clock according to claim 12, wherein the response from the diamond-based structure is mixed with the frequency reference.

14. The atomic clock according to claim 12, wherein the response is low-pass filtered to obtain a demodulated response signal.

15. The atomic clock device according to claim 1, wherein the response signal or demodulated response signal regulates a phase locked loop architecture.

16. The atomic clock device according to claim 1, wherein the at least one light emitting diodes, the microwave pump and probe generators and the radiofrequency pump and probe generators are configured to generate a repeated excitation sequence.

17. The atomic clock device according to claim 16, wherein the repeated excitation sequence comprises at least one π pulse of the probe microwave signal and/or at least one π pulse of the radiofrequency probe signal.

18. The atomic clock device according to claim 1, wherein a ratio between the full width at half maximum $\delta\omega_p$ around an effective frequency corresponding to the sharp spectral feature and the effective frequency $\omega_p$ is less than $10^{-9}$, preferably less than $10^{-10}$, more preferably less than $10^{-12}$.

19. A method for generating a clock signal, the method comprising the steps of:
- illuminating a diamond-based structure with nitrogen-vacancy defects and nitrogen-vacancy clusters with at least one light emitting diode-;
- generating a microwave pump signal;
- generating a pulsed microwave probe signal;
- generating a radiofrequency pump signal;
- generating a pulsed radiofrequency probe signal;
- feeding the microwave pump signal, the pulsed microwave probe signal, the radiofrequency pump signal and the pulsed radiofrequency probe signal to the diamond-based structure;
- obtaining a response from the diamond-based structure, wherein a frequency spectrum of said response comprises a sharp spectral feature; and
- generating an output clock signal based on said sharp spectral feature.

* * * * *